(12) United States Patent
Kang et al.

(10) Patent No.: US 12,308,320 B2
(45) Date of Patent: May 20, 2025

(54) SEMICONDUCTOR DEVICE AND METHOD FOR FABRICATING SEMICONDUCTOR DEVICE

(71) Applicant: Samsung Electronics Co., Ltd., Suwon-si (KR)

(72) Inventors: Sung Jin Kang, Seoul (KR); Jong Min Baek, Seoul (KR); Deok Young Jung, Seoul (KR); Jun Hyuk Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 658 days.

(21) Appl. No.: 17/671,088

(22) Filed: Feb. 14, 2022

(65) Prior Publication Data

US 2022/0392841 A1 Dec. 8, 2022

(30) Foreign Application Priority Data

Jun. 8, 2021 (KR) .......................... 10-2021-0074228

(51) Int. Cl.
*H01L 23/535* (2006.01)
*H01L 21/768* (2006.01)
*H01L 23/528* (2006.01)

(52) U.S. Cl.
CPC ...... *H01L 23/535* (2013.01); *H01L 21/76805* (2013.01); *H01L 21/76816* (2013.01);
(Continued)

(58) Field of Classification Search
CPC ......... H01L 21/76805; H01L 21/76816; H01L 21/76831; H01L 21/76843;
(Continued)

(56) References Cited

U.S. PATENT DOCUMENTS 6,579,801 B1 6/2003 Dakshina-Murthy et al.
9,023,709 B2 5/2015 Moll et al.
(Continued)

*Primary Examiner* — Britt D Hanley
*Assistant Examiner* — Vicki B. Booker
(74) *Attorney, Agent, or Firm* — Muir Patent Law, PLLC

(57) ABSTRACT

A semiconductor device includes an etching stop film disposed on a substrate; an interlayer insulating film on the etching stop film; a first trench and a second trench which are spaced apart in a first direction, and penetrate the etching stop film and the interlayer insulating film, the first trench having a side wall that exposes the interlayer insulating film, and the second trench having a side wall that exposes the interlayer insulating film; a first spacer which covers the interlayer insulating film exposed by the side wall of the first trench and does not cover a portion of the side wall of the first trench; a second spacer which covers the interlayer insulating film exposed by the side wall of the second trench and does not cover a portion of the side wall of the second trench; a first barrier layer which extends along a side wall of the first spacer, the portion of the side wall of the first trench not covered by the first spacer, and a bottom surface of the first trench; a first filling film which fills the first trench, on the first barrier layer; a second barrier layer which extends along a side wall of the second spacer, the portion of the side wall of the second trench not covered by the second spacer, and a bottom surface of the second trench; and a second filling film which fills the second trench on the second barrier layer. I In the first direction, a width of the first trench and a width of the second trench are different from each other, and at a first height from a bottom surface of the substrate, a thickness of the first spacer on the side wall of the first trench is different from a thickness of the second spacer on the side wall of the second trench.

21 Claims, 17 Drawing Sheets

(52) U.S. Cl.
CPC .. *H01L 21/76831* (2013.01); *H01L 21/76843* (2013.01); *H01L 21/76895* (2013.01); *H01L 23/5283* (2013.01)

(58) Field of Classification Search
CPC ............. H01L 21/76895; H01L 23/535; H01L 23/5283; H01L 23/53295; H01L 23/528; H01L 21/76834; H01L 21/76814; H01L 21/76826; H01L 21/76832; H01L 21/76804; H01L 21/76802; H01L 21/76877
See application file for complete search history.

(56) References Cited

U.S. PATENT DOCUMENTS

| | | |
|---|---|---|
| 9,396,988 B2 | 7/2016 | Lee et al. |
| 10,293,420 B2 | 5/2019 | Duan et al. |
| 2005/0054204 A1 | 3/2005 | Yu |
| 2007/0032062 A1* | 2/2007 | Lee .................. H01L 21/76807 438/597 |
| 2016/0111325 A1* | 4/2016 | JangJian ........... H01L 23/53295 257/774 |
| 2019/0304903 A1 | 10/2019 | You et al. |

\* cited by examiner

SEMICONDUCTOR DEVICE AND METHOD FOR FABRICATING SEMICONDUCTOR DEVICE

CROSS-REFERENCE TO RELATED APPLICATION

This application claims priority under 35 U.S.C. § 119 to Korean Patent Application No. 10-2021-0074228, filed on Jun. 8, 2021, in the Korean Intellectual Property Office, the disclosure of which is incorporated by reference herein in its entirety.

BACKGROUND

1. Technical Field

The present disclosure relates to a semiconductor device and a method for fabricating the same.

2. Description of the Related Art

As down-scaling of semiconductor element progresses rapidly in recent years due to the development of electronic technology, high integration and low power consumption of the semiconductor chip are being implemented. A feature size of the semiconductor device is continuously decreasing to cope with the demands for high integration and low power consumption of the semiconductor chip. A distance between wirings decreases accordingly.

SUMMARY

Aspects of the present disclosure provide a semiconductor device capable of improving element performance and reliability.

Aspects of the present disclosure also provide a method for fabricating a semiconductor device capable of improving element performance and reliability.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

According to an exemplary embodiment of the present disclosure, a semiconductor device includes an etching stop film disposed on a substrate; an interlayer insulating film on the etching stop film; a first trench and a second trench which are spaced apart in a first direction, and penetrate the etching stop film and the interlayer insulating film, the first trench having a side wall that exposes the interlayer insulating film, and the second trench having a side wall that exposes the interlayer insulating film; a first spacer which covers the interlayer insulating film exposed by the side wall of the first trench and does not cover a portion of the side wall of the first trench; a second spacer which covers the interlayer insulating film exposed by the side wall of the second trench and does not cover a portion of the side wall of the second trench; a first barrier layer which extends along a side wall of the first spacer, the portion of the side wall of the first trench not covered by the first spacer, and a bottom surface of the first trench; a first filling film which fills the first trench, on the first barrier layer; a second barrier layer which extends along a side wall of the second spacer, the portion of the side wall of the second trench not covered by the second spacer, and a bottom surface of the second trench; and a second filling film which fills the second trench on the second barrier layer. I In the first direction, a width of the first trench and a width of the second trench are different from each other, and at a first height from a bottom surface of the substrate, a thickness of the first spacer on the side wall of the first trench is different from a thickness of the second spacer on the side wall of the second trench.

According to an exemplary embodiment of the present disclosure, a semiconductor device includes an etching stop film disposed on a substrate; an interlayer insulating film on the etching stop film; a first trench which includes a first upper trench portion that penetrates the interlayer insulating film and a part of the etching stop film, and a first lower trench portion that is connected to the first upper trench portion and penetrates the remainder of the etching stop film; a first spacer which extends along a side wall of the first upper trench portion and does not extend along a side wall of the first lower trench portion; and a wiring which fills the first trench, on the first spacer.

According to an exemplary embodiment of the present disclosure, a semiconductor device includes a first etching stop film, a second etching stop film, and a third etching stop film which are sequentially stacked on a substrate; an interlayer insulating film on the third etching stop film; a first trench and a second trench which penetrate the interlayer insulating film and the first to third etching stop films, are spaced apart from each other in a first direction, and extend in a second direction that intersects the first direction; a first spacer which covers the interlayer insulating film and the third etching stop film exposed by a side wall of the first trench; a second spacer which covers the interlayer insulating film and the third etching stop film exposed by a side wall of the second trench; a first barrier layer which extends along a side wall of the first spacer and the side wall and bottom surface of the first trench exposed by the first spacer; a first filling film which fills the first trench, on the first barrier layer; a second barrier layer which extends along a side wall of the second spacer and the side wall and bottom surface of the second trench exposed by the second spacer; a second filling film which fills the second trench, on the second barrier layer; and a separation layer disposed between the side wall of the first trench and the first spacer, and between the side wall of the second trench and the second spacer. In the first direction, a width of the first trench penetrating the first and second etching stop films is smaller than a width of the first trench penetrating the third etching stop film and the interlayer insulating film, and a width of the second trench penetrating the first and second etching stop films is smaller than a width of the second trench penetrating the third etching stop film and the interlayer insulating film. In the first direction and at a first height above a bottom surface of the substrate, the width of the first trench is smaller than the width of the second trench, and at a first height point from the substrate. Also, in the first direction and at the first height above the bottom surface of the substrate, a thickness of the first spacer on the side wall of the first trench is greater than a thickness of the second spacer on the side wall of the second trench.

According to an exemplary embodiment of the present disclosure, a method for fabricating a semiconductor device includes forming a first interlayer insulating film on which a lower wiring is formed; forming a first etching stop film, a second etching stop film, and a third etching stop film, which are stacked sequentially, on the first interlayer insulating film; forming a second interlayer insulating film on the third etching stop film; forming an upper trench which penetrates the second interlayer insulating film and the third etching stop film and exposes the second etching stop film; forming a pre spacer along an upper surface of the second interlayer insulating film and a side wall and bottom surface of the upper trench; etching a part of the pre spacer to form a spacer extending along the side wall of the upper trench, and exposing the upper surface of the second interlayer insulating film and the first etching stop film; etching the exposed first etching stop film to expose at least a part of the lower wiring; and forming an upper wiring which is in contact with the exposed lower wiring. The upper trench includes a first upper trench and a second upper trench that are spaced apart from each other in a first direction and have different thicknesses from each other in the first direction, and a thickness of the pre spacer formed along the side wall and the bottom surface of the first upper trench is different from a thickness of the pre spacer formed along the side wall and the bottom surface of the second upper trench.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Figure 1:
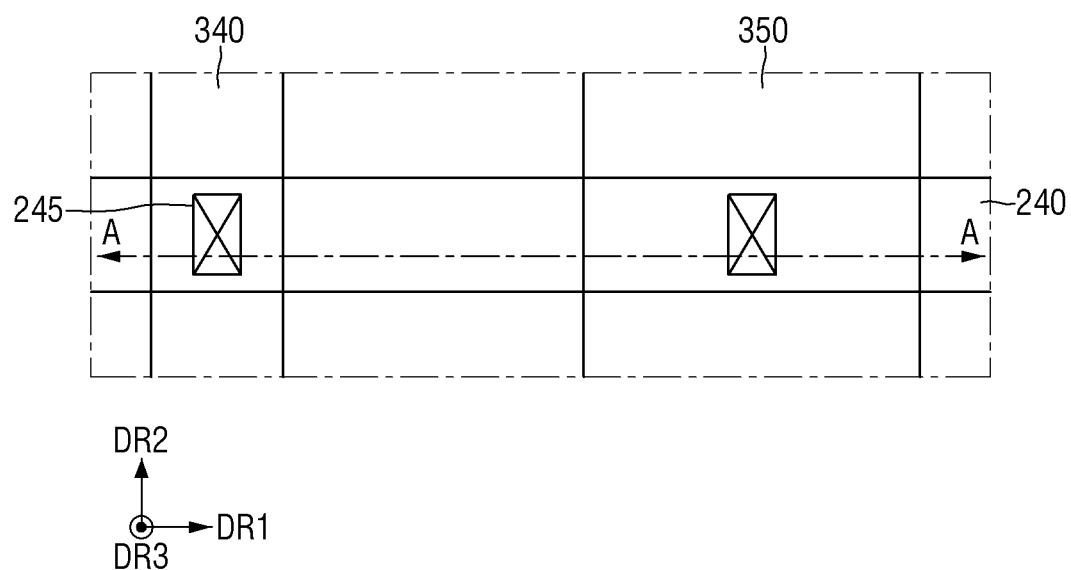
FIG. 1 is a schematic layout diagram for explaining a semiconductor device according to some embodiments.
Figure 2:
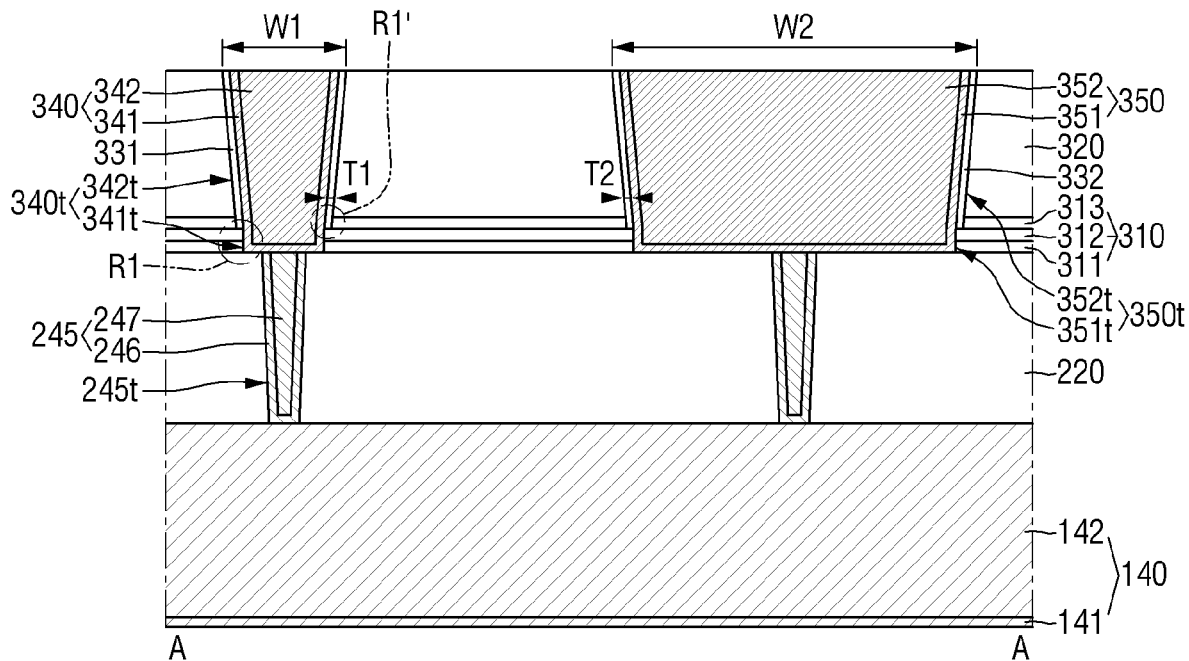
FIG. 2 is a cross-sectional view taken along A-A of FIG. 1 according to some embodiments.
Figure 3:
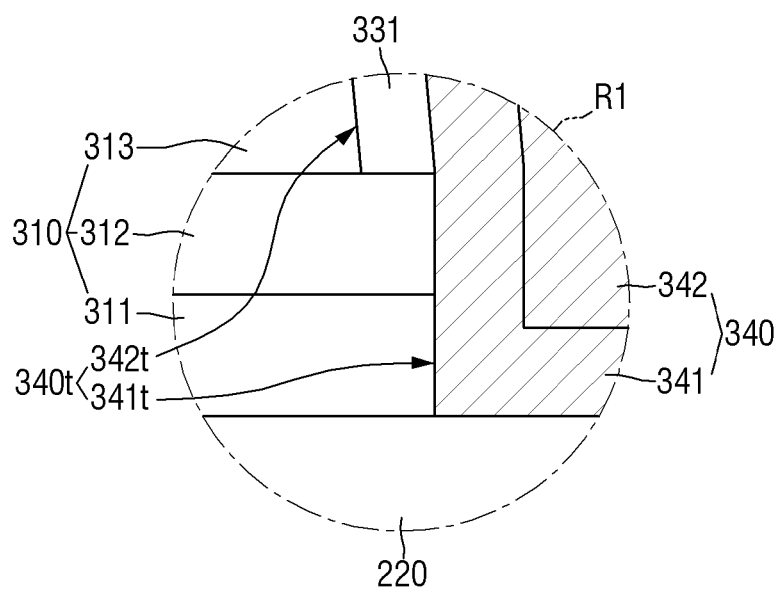
FIGS. 3 and 4 are enlarged views of a region R1 of FIG. 2.
Figure 4:
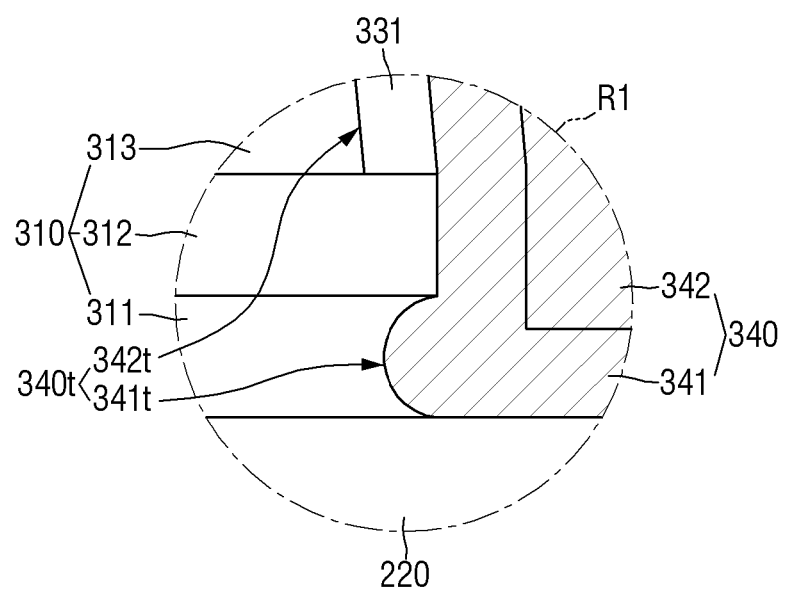
Figure 5:
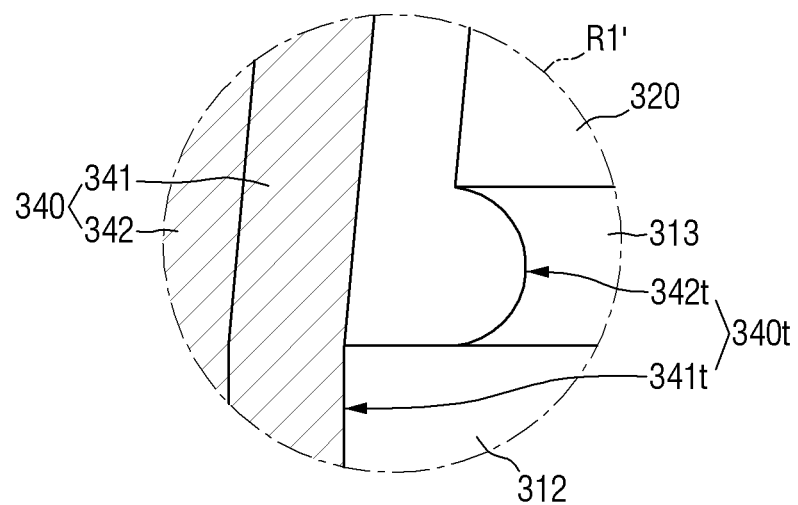
FIG. 5 is an enlarged view of a region R1' of FIG. 2.

FIG. 1 is a schematic layout diagram for explaining a semiconductor device according to some embodiments. FIG. 2 is a cross-sectional view taken along A-A of FIG. 1. FIGS. 3 and 4 are enlarged views of a region R1 of FIG. 2. FIG. 5 is an enlarged view of a region R1' of FIG. 2.

Referring to FIGS. 1 and 2, a semiconductor device according to some embodiments may include a lower wiring 140, a via 245, and upper wirings 340 and 350. The semiconductor device may be, for example, a semiconductor chip formed on a die from a wafer. The semiconductor chip may be a memory chip or a logic chip, and may include an integrated circuit, which includes the lower wiring 140, via 245, and upper wirings 340 and 350. The semiconductor device may also be a semiconductor package including one or more semiconductor chips such as described above, or may be a package-on-package device.

The lower wiring 140, via 245, and upper wirings 340 and 350 may be formed, for example, on a semiconductor substrate as part of a plurality of layers formed on the semiconductor substrate to form a semiconductor chip, and each of the lower wiring 140, the via 245, and the upper wirings 340 and 350 may be formed of a conductive material, such as a metal, for example. The lower wiring 140 may extend in a direction in which it crosses the upper wirings 340 and 350. For example, the lower wiring 140 may extend lengthwise in a first direction DR1 (e.g., a first horizontal direction), and the upper wirings 340 and 350 may extend lengthwise in a second direction DR2 (e.g., a second horizontal direction). An item, layer, or portion of an item or layer described as extending "lengthwise" in a particular direction has a length in the particular direction and a width perpendicular to that direction, where the length is greater than the width. The second direction DR2 may be a direction that intersects the first direction DR1, and may be, for example, perpendicular to the first direction DR1. A plurality of vias 245 may be connected to the lower wiring 140.

The lower wiring 140 and the via 245 may be, for example, a contact or a contact wiring formed in a MOL (Middle-of-Line) process. Alternatively, the lower wiring 140 may be a connection wiring formed in a BEOL (Back-end-of-line) process, and the via 245 may be a via formed in the BEOL process.

The upper wirings 340 and 350 may include a first wiring 340 and a second wiring 350 that are spaced apart from each other in the first direction DR1, and that each extend lengthwise in the second direction DR2. A width of the first wiring 340 in the first direction DR1 (at a particular height above the substrate, such as a height above a bottom surface of the substrate) may differ from a width of the second wiring 350 in the first direction DR1 (at the same particular height above the substrate). For example, the width of the first wiring 340 in the first direction DR1 may be smaller than the width of the second wiring 350 in the first direction DR1. The width of each of the first wiring 340 and second wiring 350 may be defined based on a width of the conductive material that forms the wiring. For example, outer side surfaces of each wiring may be defined by side surfaces of an insulative material in which the wiring is formed.

The upper wirings 340 and 350 may contact the via 245, and the via 245 may contact the lower wiring 140. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. The upper wirings 340 and 350 may be electrically connected to the lower wiring 140 through the via 245 accordingly. Although FIG. 2 shows that the first wiring 340 is connected to the lower wiring 140 through the via 245, the present disclosure is not limited thereto.

In the semiconductor device according to some embodiments, the lower wiring 140, the via 245 and the upper wirings 340 and 350 may be formed by a single damascene process.

The lower wiring 140 may include a lower barrier film 141 and a lower filling film 142. The lower filling film 142 may be formed on the lower barrier film 141. Each of the lower filling film 142 and lower barrier film 141 may be formed of a conductive material such as a metal. In one embodiment, the lower filling film 142 may be a different conductive material (e.g., different metal) from the lower barrier film 141.

A first interlayer insulating film 220 may be disposed on the lower wiring 140. The first interlayer insulating film 220 may include a via trench 245t. The via trench 245t may penetrate the first interlayer insulating film 220 and expose at least a part of an upper surface of the lower wiring 140.

The first interlayer insulating film 220 may be formed, for example, of an insulating material such as silicon oxide, silicon nitride, silicon oxynitride, and/or a low-k material.

The via 245 may fill the via trench 245t. The via 245 may contact the lower wiring 140 and may be electrically connected to the lower wiring 140. The via 245 may include a via barrier film 246 and a via filling film 247.

The via barrier film 246 may be conformally formed along the profile of the via trench 245t. The via barrier film 246 may extend along the side walls and bottom surface of the via trench 245t. The via filling film 247 may fill the via trench 245t on the via barrier film 246. Each of the via filling film 247 and via barrier film 246 may be formed of a conductive material such as a metal. In one embodiment, the via filling film 247 may be a different conductive material (e.g., different metal) from the via barrier film 246.

An etching stop film 310 may be disposed on the first interlayer insulating film 220. The etching stop film 310 according to some embodiments may include a first etching stop film 311, a second etching stop film 312, and a third etching stop film 313. The first etching stop film 311, the second etching stop film 312, and the third etching stop film 313 may be stacked in a third direction DR3, and may each be described as an etching stop layer.

The first etching stop film 311 and the third etching stop film 313 may be formed of or may include a material having an etching selectivity with respect to the second etching stop film 312. For example, the first etching stop film 311 and the third etching stop film 313 may be formed of or may include a metal element, and the second etching stop film 312 may not include a metal element. For example, the first etching stop film 311 and the third etching stop film 313 may be formed of or may include aluminum oxide ($Al_2O_3$). The second etching stop film 312 may be formed of or may include oxycarbide such as a silicon oxycarbide.

The second interlayer insulating film 320 may be disposed on the etching stop film 310. The second interlayer insulating film 320 may be formed, for example, of an insulating material such as silicon oxide, silicon nitride, silicon oxynitride, and/or a low-k material. The second interlayer insulating film 320 and the etching stop film 310 may include upper wiring trenches 340t and 350t. The upper wiring trenches 340t and 350t may penetrate the second interlayer insulating film 320 and the etching stop film 310. The upper wiring trenches 340t and 350t may expose, for example, at least a part of the first interlayer insulating film 220 and/or the via 245 with respect to the etching stop film 310.

The first interlayer insulating film 220 and the second interlayer insulating film 320 may be formed of or may include, for example, at least one of silicon oxide, silicon nitride, silicon oxynitride and a low dielectric constant material. For example, the first interlayer insulating film 220, and the second interlayer insulating film 320 may be formed of or may include a low dielectric constant material to reduce a coupling phenomenon between the conductive patterns. The low dielectric constant material may be, for example, a silicon oxide having an appropriately high carbon and hydrogen, and may be a material such as SiCOH.

The low dielectric constant material may be or may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The upper wiring trenches 340t and 350t may include a first trench 340t and a second trench 350t that are spaced apart from each other in the first direction DR1. In some embodiments, the first trench 340t and the second trench 350t may have different widths from each other in the first direction DR1. In the first direction DR1, a maximum width W1 of the first trench 340t may be smaller than a maximum width W2 of the second trench 350t. In some embodiments, in the first direction DR1, a maximum width W1 of the first trench 340t may be smaller than the minimum width of the second trench 350t. Also, in some embodiments, at a given height in the third direction DR3, the width of the first trench 340t in the first direction DR1 is smaller than the width of the second trench 350t in the first direction DR1.

In some embodiments, the upper wiring trench 340t (also described as a first trench 340t) includes an upper trench 342t and a lower trench 341t (also described as an upper trench portion and lower trench portion), and the upper wiring trench 350t (also described as a second trench 350t) includes an upper trench 352t and a lower trench 351t (also described as an upper trench portion and lower trench portion). The widths of the upper trenches 342t and 352t in the first direction DR1 may increase in a direction away from the substrate in the third direction DR3 (e.g., in an upward direction based on the orientation of the figures). The upper trench 342t and lower trench 341t may be connected to each other (e.g., directly connected as part of the upper wiring trench 340t). The upper trench 352t and lower trench 351t may be connected to each other (e.g., directly connected as part of the upper wiring trench 350t).

The lower trenches 341t and 351t may penetrate at least a part of the etching stop film 310, and the upper trenches 342t and 352t may penetrate the remainder of the etching stop film 310 and the second interlayer insulating film 320. The lower trenches 341t and 351t may penetrate the first etching stop film 311 and the second etching stop film 312, and the upper trenches 342t and 352t may penetrate the third etching stop film 313 and the second interlayer insulating film 320. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Referring to FIG. 3, according to some embodiments, the side wall of the first trench 340t may include a stepped shape. For example, the side wall of the first trench 340t may have a stepped shape at a connection between the first lower trench 341t and the first upper trench 342t. In the first direction DR1, the width of the first lower trench 341t may be smaller than the width of the first upper trench 342t, and the width of the top of the first lower trench 341t may be smaller than the width of the bottom of the first upper trench 342t. In some embodiments, the width of the first lower trench 341t in the first direction DR1 may be substantially constant.

The side wall of the second trench 350t may include a stepped shape similar to the first trench 340t.

Referring to FIG. 4, according to some embodiments, the side wall of the first trench 340t may include a convex portion protruding toward the first etching stop film 311. For example, the side wall of the first lower trench 341t inside the first etching stop film 311 may be convex toward the first etching stop film 311. The width of the first lower trench 341t inside the first etching stop film 311 in the first direction DR1 may increase and then decrease in a direction toward the substrate in the third direction DR3. Though only one sidewall of the first trench 340t is shown, the opposite sidewall in the first direction DR1 may also have the same convex portion.

The first barrier film 341 to be described below may fill the first lower trench 341t that is recessed toward the first etching stop film 311. The first barrier film 341 may partially extend toward the first etching stop film 311 between the first interlayer insulating film 220 and the second etching stop film 312.

The side wall of the second trench 350t may include a convex portion toward the first etching stop film 311, similar to the first trench 240t.

Referring to FIG. 5, according to some embodiments, the side wall of the first trench 340t may include a convex portion toward the third etching stop film 313. For example, the side wall of the first upper trench 342t inside the third etching stop film 313 may be convex toward the third etching stop film 313. The width of the first lower trench 341t inside the third etching stop film 313 in the first direction DR1 may increase and then decrease in a direction toward the substrate in the third direction DR3. Though only one sidewall of the first trench 340t is shown, the opposite sidewall in the first direction DR1 may also have the same convex portion.

The first spacer 331 to be described below may fill the first upper trench 342t that is recessed toward the third etching stop film 313. The first spacer 331 may partially extend toward the third etching stop film 313 between the second interlayer insulating film 320 and the second etching stop film 312.

The side wall of the second trench 350t may include a convex portion toward the third etching stop film 313, similar to the first trench 240t.

Referring to FIGS. 1 and 2 again, the first spacer 331 may be disposed on the side walls of the first upper trench 342t. For example, the first spacer 331 may extend along the side walls of the first upper trench 342t to the upper surface of the second etching stop film 312.

In some embodiments, a thickness T1 of the first spacer 331 on the side walls of the first trench 340t, at least within the second interlayer insulating layer 320, and in some embodiments, up to the second etching stop film 312, may be substantially constant. Terms such as "same," "equal," "planar," "coplanar," "constant," "parallel," and "perpendicular," as used herein encompass identicality or near identicality including variations that may occur, for example, due to manufacturing processes. The term "substantially" may be used herein to emphasize this meaning, unless the context or other statements indicate otherwise.

The first wiring 340 may be disposed on the first spacer 331. The first wiring 340 may fill the first trench 340t. The first wiring 340 may include a first barrier film 341 and a first filling film 342.

The first barrier film 341 may extend along the first spacer 331 and the bottom surface of the first trench 341t. The first barrier film 341 may extend along the first spacer 331 and the side walls and bottom surface of the first lower trench 341t. For example, the first barrier film 341 may be conformally formed along the first spacer 331 and the side walls and bottom surface of the first lower trench 341t. Accordingly, the first spacer 331 may be disposed between the first barrier film 341 and the second interlayer insulating film 320, and between the first barrier film 341 and the third etching stop film 313. The first barrier film 341 may be spaced apart from the second interlayer insulating film 320 and the third etching stop film 313 by the first spacer 331.

The first filling film 342 may fill the first trench 341t on the first barrier film 341.

The second spacer 332 may be disposed on the side walls of the second upper trench 352t. The second spacer 332 may extend along the side wall of the second upper trench 352t to the upper surface of the second etching stop film 312.

In some embodiments, a thickness T2 of the second spacer 332 on the side walls of the second trench 350t may be substantially constant, at least within the second interlayer insulating layer 320, and in some embodiments, up to the second etching stop film 312.

In some embodiments, the thickness T1 of the first spacer 331 on the side walls of the first trench 340t may be substantially the same as the thickness T2 of the second spacer 332 on the side walls of the second trench 350t. The thickness T1 of the first spacer 331 on the side walls of the first trench 340t and the thickness T2 of the second spacer 332 on the side walls of the second trench 350t may be values measured at a height in the third direction DR3 that is the same height point from the second etching stop film 312.

The second wiring 350 may be disposed on the second spacer 332. The second wiring 350 may fill the second trench 350t. The second wiring 350 may include a second barrier film 351 and a second filling film 352.

The second barrier film 351 may extend along the second spacer 332 and the bottom surface of the second trench 350t. The second barrier film 351 may extend along the second spacer 332 and the side walls and the bottom surface of the first lower trench 351t. For example, the second barrier film 351 may be conformally formed along the second spacer 332 and the side walls and bottom surface of the second lower trench 351t. Accordingly, the second spacer 332 may be disposed between the second barrier film 351 and the second interlayer insulating film 320, and between the second barrier film 351 and the third etching stop film 313. The second barrier film 351 may be spaced apart from the second interlayer insulating film 320 and the third etching stop film 313 by the second spacer 332.

In the semiconductor device according to some embodiments, because the first barrier film 341 and the second barrier film 351 are formed conformally along the profile of the first spacer 331 and the second spacer 332 due to the first spacer 331 and the second spacer 332, the adhesive strength of the first barrier film 341 and the second barrier film 351 may be improved.

The second filling film 352 may fill the second trench 350t on the second barrier film 351.

The first spacer 331 and the second spacer 332 may include a material that does not induce oxidation of the second interlayer insulating film 320. The first spacer 331 and the second spacer 332 may be formed of or may include, for example, a low dielectric constant material. The first spacer 331 and the second spacer 332 may be formed of or may include, for example, an insulating material such as at least one of silicon oxide ($SiO_x$), silicon carbide (SiC), silicon nitride (SiN), silicon oxynitride (SiON), silicon carbonitride (SiCN), silicon oxycarbide (SiOC) and SiCOH.

In the semiconductor device according to some embodiments, each of the first spacer 331 and the second spacer 332 is a silicon oxide layer, for example, consisting of silicon oxide.

The lower barrier film 141, the via barrier film 246, the first barrier film 341, and the second barrier film 351 may be formed of or may include, for example, a conductive material, and may be formed of or may include at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh).

The lower filling film 142, the via filling film 247, the first filling film 342 and the second filling film 352 may be formed of or may include a conductive material such as a metal, for example, at least one of aluminum (Al), copper (Cu), tungsten (W), and cobalt (Co).

According to some embodiments, separation layers (500 of FIGS. 16 to 22) may be formed on both (e.g., opposite) side walls of the first trench 341t and both (e.g., opposite) side walls of the second trench 332t. For example, the separation layer 500 may be formed on the second interlayer insulating film 320, the third etching stop film 313 and the second etching stop film 312 that define both sides walls of the first trench 341t, and the second interlayer insulating film 320, the third etching stop film 313 and the second etching stop film 312 that define both side walls of the second trench 332t. Also, according to the embodiment, the separation layer 500 may also be formed on the bottom surface of the first trench 341t and/or the bottom surface of the second trench 332t.

The separation layer 500 may include, for example, an inhibitor that is used in inhibitor plasma, which will be described later.

FIGS. 6 to 14 are diagrams for explaining a semiconductor device according to some embodiments. For convenience of explanation, points different from those described referring to FIGS. 1 to 5 will be mainly described. For reference, FIGS. 6 to 14 are cross-sectional views taken along A-A of FIG. 1.

Figure 6:
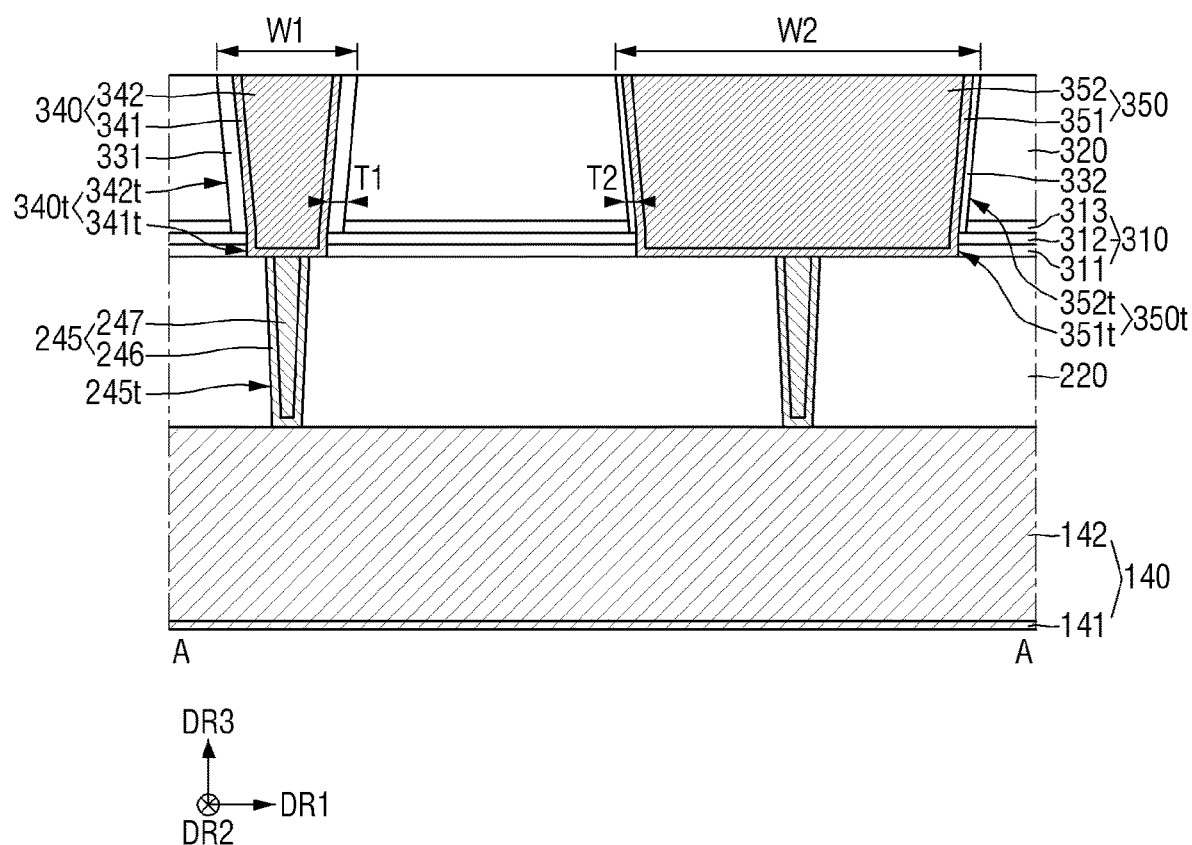
FIGS. 6 to 14 are diagrams for explaining a semiconductor device according to some embodiments.

Referring to FIG. 6, in the semiconductor device according to some embodiments, the thickness T1 of the first spacer 331 on the side wall of the first trench 340t having a first width W1 may differ from the thickness T2 of the second spacer 332 on the side wall of the second trench 350t, which has a second width W2 greater than the first width W1. For example, the thickness T2 of the second spacer 332 may be smaller than the thickness T1 of the first spacer 331.

Figure 7:
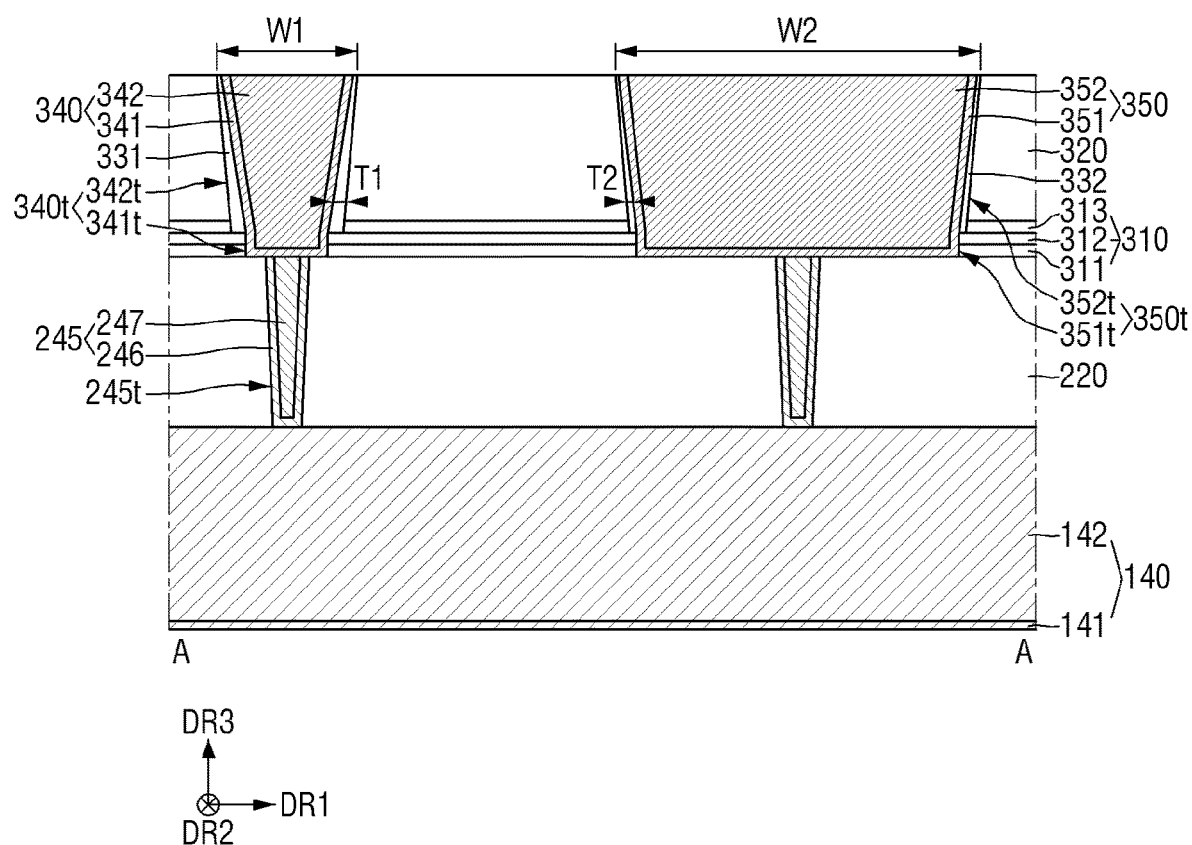

Referring to FIG. 7, in the semiconductor device according to some embodiments, the thickness T1 of the first spacer 331 on the side wall of the first trench 341t may decrease as it goes away from the first interlayer insulating film 220 (e.g., in the third direction DR3). According to some embodiments, the thickness T2 of the second spacer 332 on the side wall of the second trench 332t may decrease as it goes away from the first interlayer insulating film 220 (e.g., in the third direction DR3).

According to some embodiments, the thickness T2 of the second spacer 332 on the side wall of the second trench 332t may be smaller than the thickness T1 of the first spacer 331 on the side wall of the first trench 341t. The thickness T2 of the second spacer 332 on the side wall of the second trench 332t and the thickness T1 of the first spacer 331 on the side wall of the first trench 341t may be values measured at the same height point in the third direction DR3 from the etching stop film 310.

Figure 8:
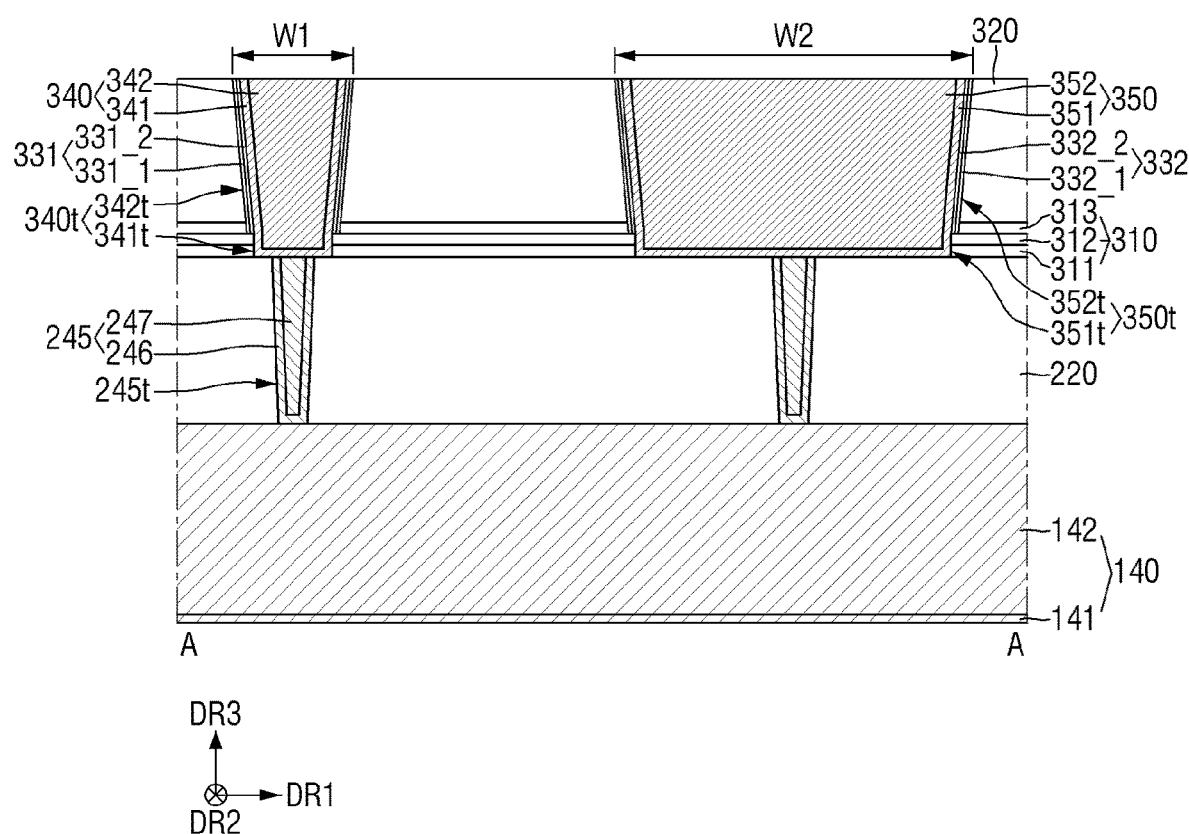

Referring to FIG. 8, in the semiconductor device according to some embodiments, at least one of the first spacer 331 and the second spacer 332 may be made up of a plurality of spacer films, or a plurality of sub-layers.

For example, the first spacer 331 may include a first spacer film 331_1 and a second spacer film 331_2. The first spacer film 331_1 may extend along the side wall of the upper trench 342t. The second spacer film 331_2 may extend along the first spacer film 331_1. The first wiring 340 may be disposed on the first spacer 331.

The second spacer 332 may include a third spacer film 332_1, and a fourth spacer film 332_2 on the third spacer film 332_1. The third spacer film 332_1 may extend along the side wall of the upper trench 352t. The fourth spacer film 332_2 may extend along the third spacer film 332_1. The second wiring 350 may be disposed on the second spacer 332.

The first spacer film 331_1, the second spacer film 331_2, the third spacer film 332_1, and the fourth spacer film 332_2 may be formed of the same material as each other. In some cases, although the first spacer film 331_1 and second spacer film 331_2 may be formed in separate processes, and the third spacer film 332_1 and fourth spacer film 332_2 may be formed in separate processes, a boundary between the first spacer film 331_1 and the second spacer film 331_2 and/or a boundary between the third spacer film 332_1 and the fourth spacer film 332_2 may not be distinguished. For example, the first spacer film 331_1, the second spacer film 331_2, the third spacer film 332_1, and the fourth spacer film 332_2 may be silicon oxide. In still another example, the first spacer film 331_1, the second spacer film 331_2, the third spacer film 332_1 and the fourth spacer film 332_2 may be SiCOH.

The first spacer film 331_1 may include a material different from the second spacer film 331_2, and the third spacer film 332_1 may include a material different from the fourth spacer film 332_2. For example, the first spacer film 331_1 and the third spacer film 332_1 may be formed of silicon oxide, and the second spacer film 331_2 and the fourth spacer film 332_2 may be formed of SiCOH. In still another example, the first spacer film 331_1 and the third spacer film 332_1 may be formed of SiCOH, and the second spacer film 331_2 and the fourth spacer film 332_2 may be formed of silicon oxide.

Any one of those described for the first spacer 331 and the second spacer 332 of FIGS. 2 to 5 may be applied as the first spacer film 331_1 and the third spacer film 332_1.

The thickness of the second spacer film 331_2 on the first spacer film 331_1 and the thickness of the fourth spacer film 333_2 on the third spacer film 332_1 may be, for example, substantially constant. The thickness of the second spacer film 331_2 on the first spacer film 331_1 and the thickness of the fourth spacer film 333_2 on the third spacer film 332_1 may decrease in the third direction DR3 away from the first interlayer insulating film 220 in still another example.

According to some embodiments, a separation layer (not shown) may be further formed between the first spacer film 331_1 and the second spacer film 331_2, and between the third spacer film 332_1 and the fourth spacer film 332_2. The separation layer may include, for example, an inhibitor that is used in inhibitor plasma, which will be described later.

According to some embodiments, the concentration of the inhibitor in the separation layer formed on both side walls of the first upper trench 341t and both side walls of the second upper trench 332t may be the same as or different from the concentration of the inhibitor in the separation layer formed between the first spacer film 331_1 and the second spacer film 331_2, and between the third spacer film 332_1 and the fourth spacer film 332_2.

Figure 9:
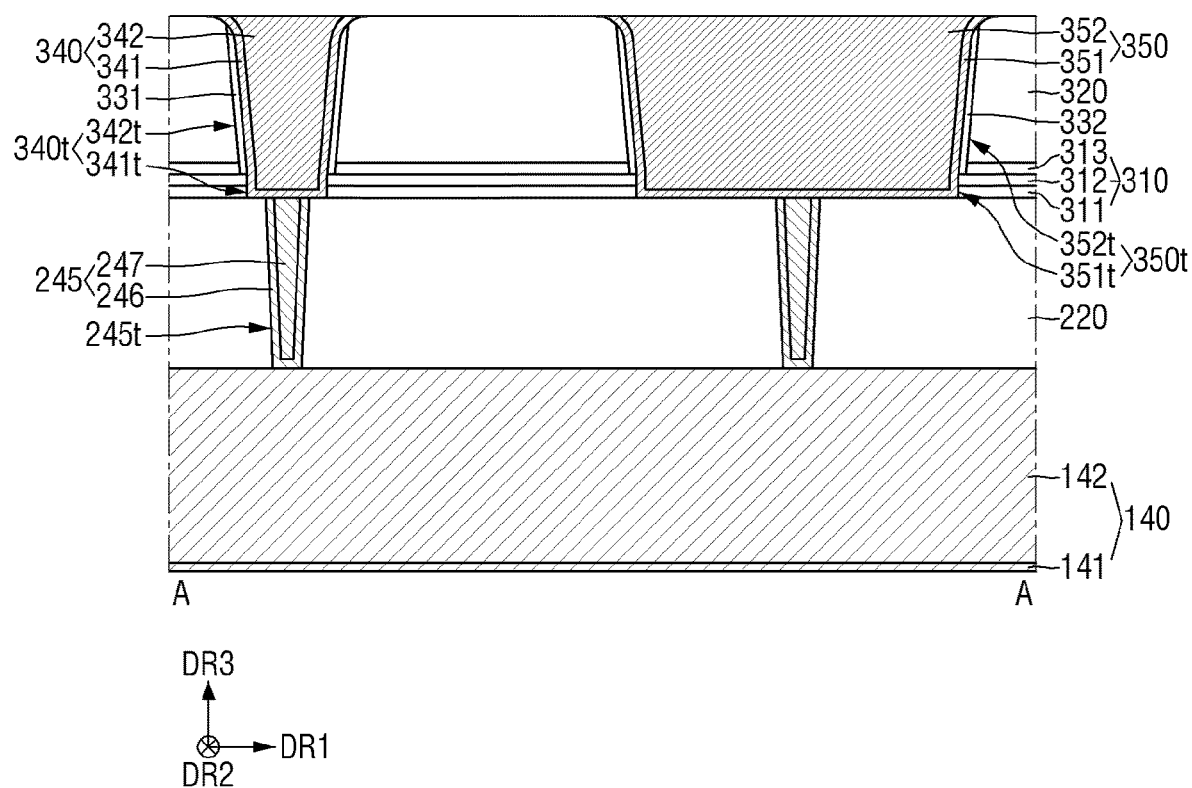

Referring to FIG. 9, in the semiconductor device according to some embodiments, the upper side wall of the second interlayer insulating film 320 and the upper side wall of the first spacer 331 may be rounded. The upper side wall of the second interlayer insulating film 320 and the upper side wall of the second spacer 332 may be rounded.

Figure 10:
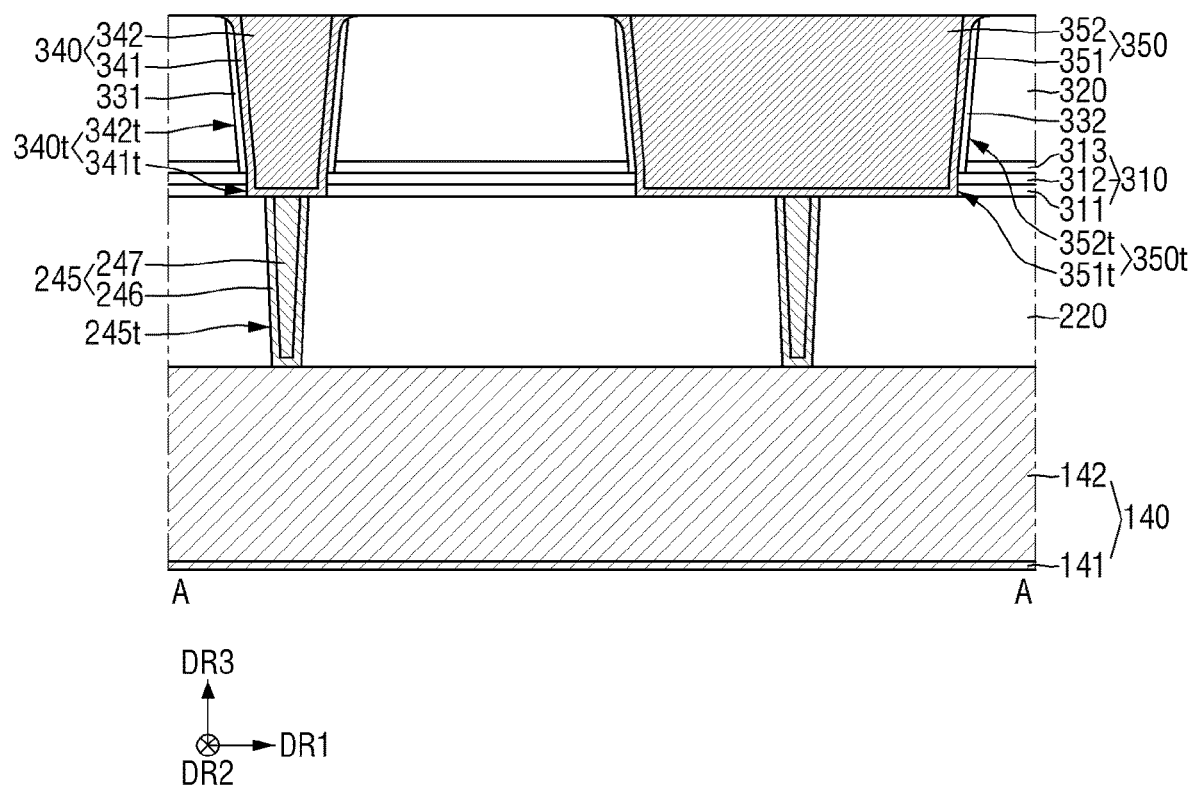

Referring to FIG. 10, in the semiconductor device according to some embodiments, the upper side wall of the first spacer 331 and the upper side wall of the second spacer 332 may be rounded.

Figure 11:
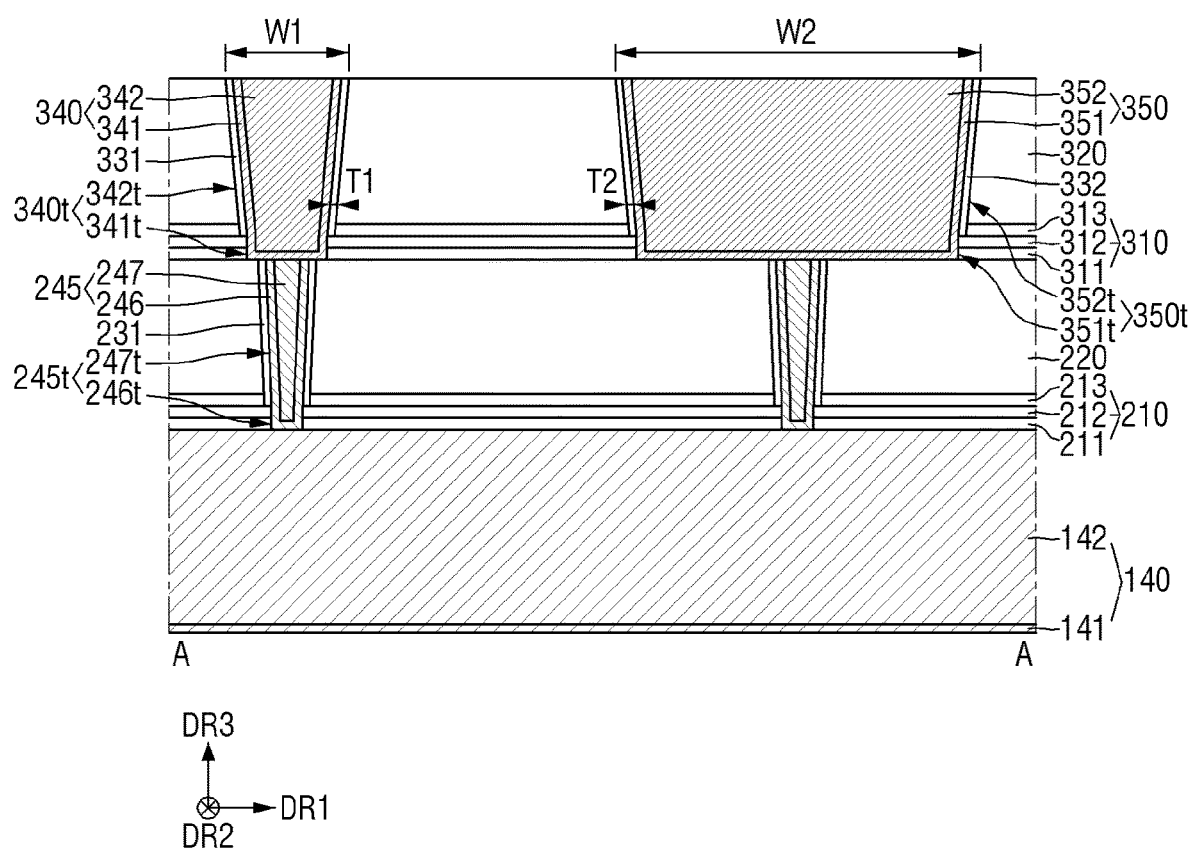

Referring to FIG. 11, in the semiconductor device according to some embodiments, an etching stop film 210 may be further disposed between the lower wiring 140 and the first interlayer insulating film 220. The etching stop film 210 may include a first etching stop film 211, a second etching stop film 212, and a third etching stop film 213. The first etching stop film 211, the second etching stop film 212, and the third etching stop film 213 may be stacked in the third direction DR3.

The first etching stop film 211 and the third etching stop film 213 may be formed of or may include a material having an etching selectivity with respect the second etching stop film 212. For example, the first etching stop film 211 and the third etching stop film 213 may include metal, and the second etching stop film 112 may not include metal. For example, the first etching stop film 211 and the third etching stop film 213 may be formed of aluminum oxide ($Al_2O_3$). The second etching stop film 212 may be formed of oxycarbide such as silicon oxycarbide.

According to some embodiments, the first to third etching stop films 211, 212 and 213 may include the same material as the first to third etching stop films 311, 312 and 313.

The via trench 245t may penetrate the first interlayer insulating film 220 and the etching stop film 210. The via trench 245t may include a via lower trench 246t and a via upper trench 247t. The via lower trench 246t may penetrate at least part of the etching stop film 210, and the via upper trench 247t may penetrate the remainder of the etching stop film 210 and the second interlayer insulating film 320. The via lower trench 246t may penetrate the first etching stop film 211 and the second etching stop film 212, and the via upper trench 247t may penetrate the third etching stop film 213 and the first interlayer insulating film 120.

The side wall of the via trench 245t may include a stepped shape. For example, the side wall of the via trench 245t may have a stepped shape at the connection between the via lower trench 246t and the via upper trench 247t. In the first direction DR1, the width of the via lower trench 246t may be smaller than the width of the via upper trench 247t, and the width of the top of the via lower trench 246t may be smaller than the width of the bottom of the via upper trench 247t. In some embodiments, the width of the via lower trench 246t in the first direction DR1 may be substantially constant.

The via spacer 231 may be disposed on the side wall of the via upper trench 247t. The via spacer 231 may extend along the side wall of the via upper trench 247t to the upper surface of the second etching stop film 212.

For example, the thickness of the via spacer 231 on the side wall of the via trench 245t may decrease as it goes away from the lower wiring 140 (i.e., upward in the third direction DR3). In still another example, the thickness of the via spacer 231 on the side wall of the via trench 245t may be substantially constant.

The thickness of the via spacer 231 on the side wall of the via trench 240t may be, for example, substantially the same as the thickness T2 of the second spacer 332 on the side wall of the second trench 332t and the thickness Ti of the first spacer 331 on the side wall of the first trench 341t.

The thickness of the via spacer 231 on the side wall of the via trench 240t may be greater than, for example, the thickness T2 of the second spacer 332 on the side wall of the second trench 332t. The thickness of the via spacer 231 on the side wall of the via trench 240t and the thickness T2 of the second spacer 332 on the side wall of the second trench 332t may be values measured at the same height point from the etching stop film 310 in the third direction DR3.

Figure 12:
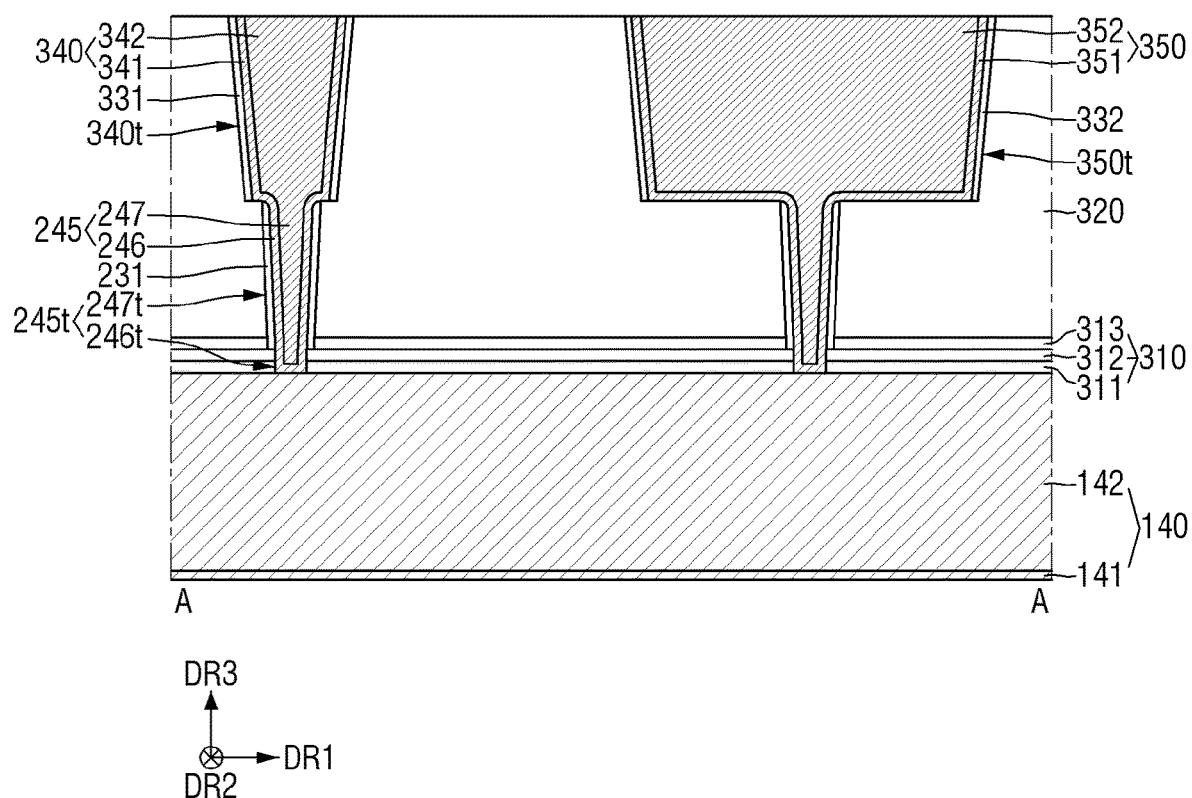

Referring to FIG. 12, in the semiconductor devices according to some embodiments, the via 245 and the upper wirings 340 and 350 may be formed by a dual damascene process. The lower wiring 140 may be formed by the dual damascene process.

The etching stop film 310 may be disposed on the lower wiring 140. The second interlayer insulating film 320 may be disposed on the etching stop film 310.

The first trench 340t and the second trench 350t may be connected to the via trench 245t. The first trench 340t and the second trench 350t may be connected to the via upper trench 247t. The via upper trench 247t may penetrate the second interlayer insulating film 230 and the third etching stop film 313. The via lower trench 246t may penetrate the second etching stop film 312 and the first etching stop film 311.

The first spacer 331 may extend along the side wall of the first trench 340t. The second spacer 332 may extend along the side wall of the second trench 350t. The via spacer 231 may extend along the side wall of the via upper trench 247t.

According to some embodiments, the first and second spacers 331 and 332 may not be disposed on at least a part of the bottom surfaces of the first and second trenches 340t and 350t. The point on which the side walls of the via spacer 231 and/or the via upper trench 247t join the bottom surfaces of the first and second trenches 340t and 350t may be rounded. This may be due to a top corner rounding (TCR) process to be described below.

The first barrier film 341 and the via barrier film 346 may be integrally formed, and the second barrier film 351 and the via barrier film 346 may be integrally formed. The first filling film 342 and the via filling film 347 may be integrally formed, and the second filling film 352 and the via filling film 347 may be integrally formed. Being integrally formed refers to being formed as a single continuous structure with no grain boundaries therebetween, for example, based on being formed in a single process step.

Figure 13:
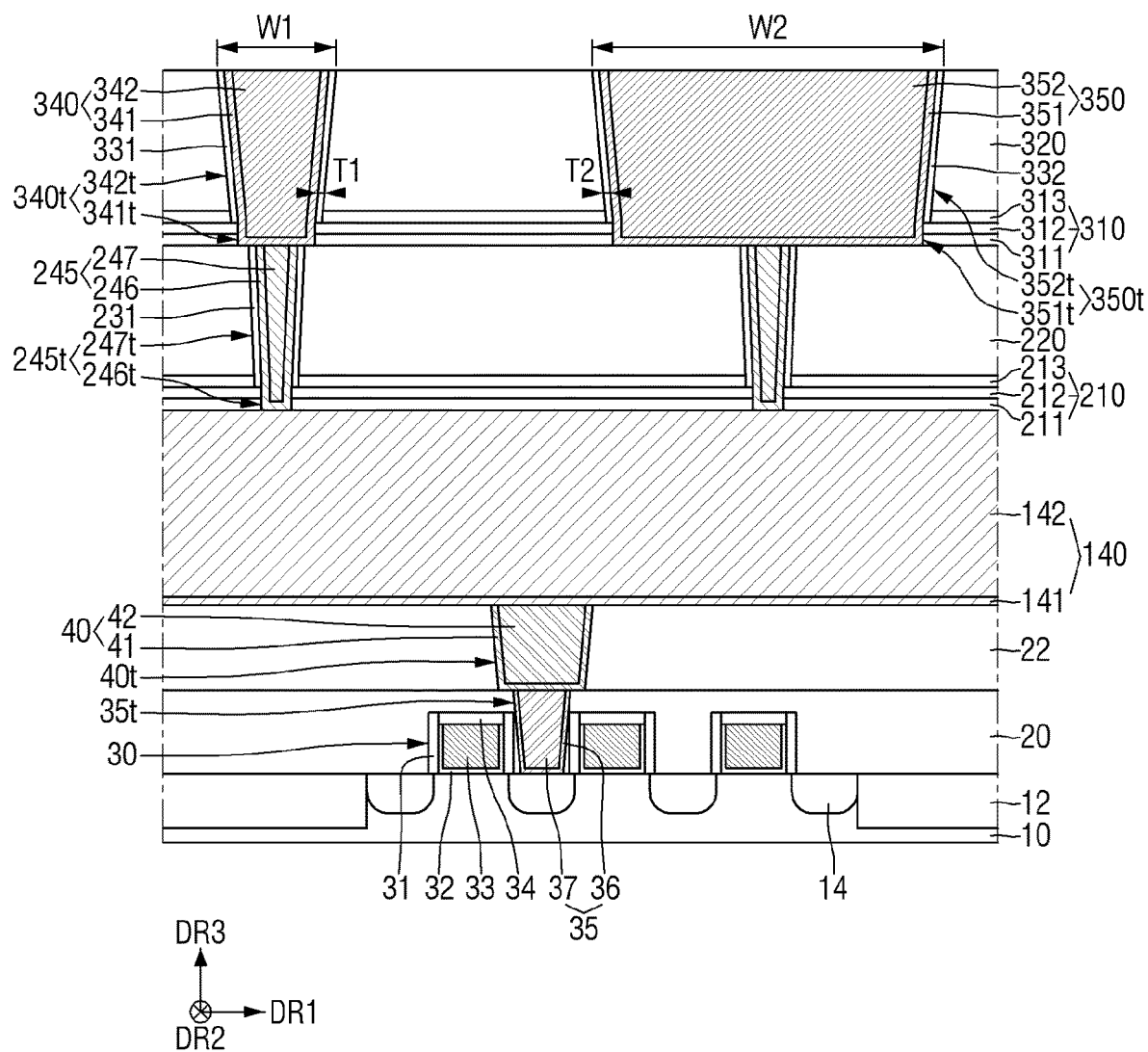

Referring to FIG. 13, the lower wiring 140 of the semiconductor device according to some embodiments may be a connection wiring formed in a BEOL (Back-end-of-line) process. The first contact 35 and the second contact 40 may be a contact or a contact wiring formed in the MOL (Middle-of-Line) process.

The substrate 10 may include a field insulating film 12 and an active region defined by the field insulating film 12. The substrate 10 may include or may be formed of semiconductor materials such as silicon, germanium, silicon-germanium, or group III-V compounds such as GaP, GaAs, and GaSb. According to some embodiments, the substrate 10 may be a silicon-on-insulator (SOI) substrate or a germanium-on-insulator (GOI) substrate. The field insulating film 12 may be or may include, for example, at least one of a silicon oxide film, a silicon nitride film, and a silicon oxynitride film.

The transistor 30 may be disposed on the active region. The transistor 30 may include a gate spacer 31, a gate insulating film 32, a gate electrode 33, a gate capping film 34, and a source/drain 14.

The gate electrode 33 may be disposed on the active region. The gate spacer 31 may be formed on the side wall of the gate electrode 33. The gate insulating film 24 may be formed between the gate electrode 33 and the active region, and between the gate electrode 33 and the gate spacer 31.

The gate capping film 34 may be formed on the gate electrode 33. The gate capping film 34 may be formed between the gate spacers 31. Although the upper surface of the gate capping film 34 may be disposed on the same plane as the upper surface of the gate spacer 31, the present disclosure is not limited thereto. The gate capping film 34 may also be formed on the gate electrode 33 and the gate spacer 31. Alternatively, the gate capping film 34 may be omitted, and the upper surface of the gate electrode 33 may be disposed on the same plane as the upper surface of the gate spacer 31.

The source/drain 14 may be formed on at least one side of the gate electrode 33. Although the source/drain 14 may be formed inside the substrate 10, the present disclosure is not limited thereto.

The lower interlayer insulating film 20 may be disposed on the substrate 10. The lower interlayer insulating film 20 may cover the transistor 30. The lower interlayer insulating film 20 may include a first contact trench 35*t*. The first contact 35 may fill the first contact trench 35*t*. The first contact 35 may include a lower contact barrier film 36 extending along the side wall and bottom surface of the first contact trench 35*t*, and a lower contact filling film 37 that fills the first contact trench 35*t* on the lower contact barrier film 36.

The upper interlayer insulating film 22 may be disposed on the lower interlayer insulating film 20. The upper interlayer insulating film 22 may include a second contact trench 40*t*. The second contact 40 may fill the second contact trench 40*t*. The second contact 40 may include an upper contact barrier film 41 extending along the side walls and bottom surface of the second contact trench 40*t*, and an upper contact filling film 42 that fills the second contact trench 40*t* on the upper contact barrier film 41.

The first contact 35 may penetrate the lower interlayer insulating film 20 and electrically connect the second contact 40 and the source/drain 14, and the second contact 40 may penetrate the upper interlayer insulating film 22 and electrically connect the first contact 35 and the lower wiring 140.

According to some embodiments, no spacer may be formed between the first contact 35 and the lower interlayer insulating film 20, and between the second contact 40 and the upper interlayer insulating film 22.

Although the transistor 30 is shown as a planar transistor formed on the substrate 10, the embodiment is not limited thereto. The transistor 30 may include a fin-type transistor (FinFET) including a channel region of a fin-type pattern shape, a tunneling transistor (tunneling FET), a transistor including a nanowire, a transistor including a nanosheet or a three-dimensional (3D) transistor. Further, the transistor 30 may also include a bipolar junction transistor, a laterally diffused metal oxide semiconductor (LDMOS), or the like.

A semiconductor device according to some embodiments will be described referring to FIG. 14, focusing on points different from those described using FIG. 13.

Figure 14:
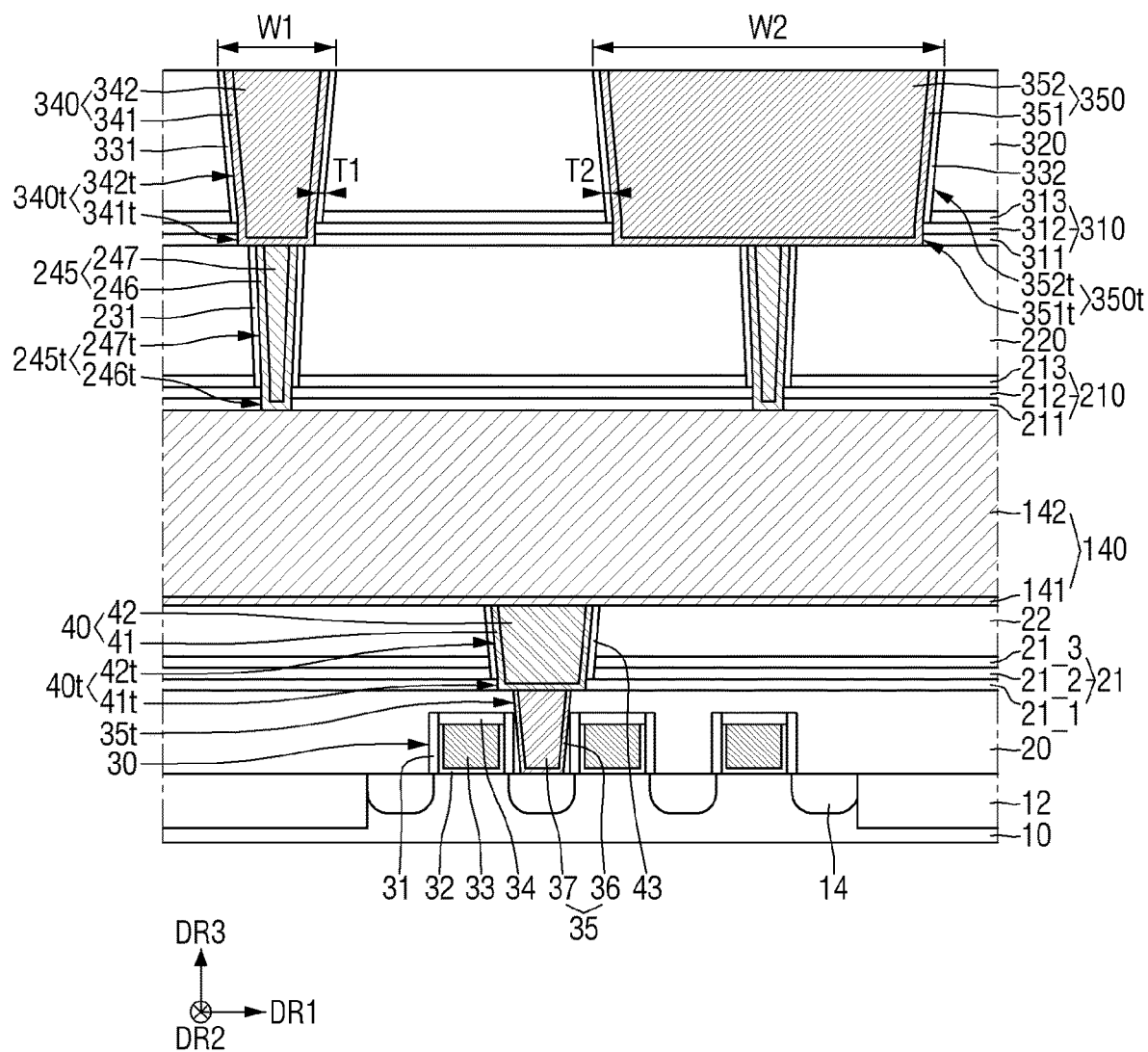

Referring to FIG. 14, in a semiconductor device according to some embodiments, the etching stop film 21 may be formed between the lower interlayer insulating film 20 and the upper interlayer insulating film 22. The etching stop film 21 may include a first etching stop film 21_1, a second etching stop film 21_2, and a third etching stop film 21_3. The first etching stop film 21_1, the second etching stop film 21_2, and the third etching stop film 213_3 may be stacked in the third direction DR3.

The first etching stop film 21_1 and the third etching stop film 21_3 may include or be formed of a material having an etching selectivity with respect to the second etching stop film 21_2. For example, the first etching stop film 21_1 and the third etching stop film 21_3 may include or may be formed of a metal, and the second etching stop film 112 may include no metal. For example, the first etching stop film 21_1 and the third etching stop film 21_3 may include or be formed of aluminum oxide ($Al_2O_3$). The second etching stop film 21_2 may include or be formed of oxycarbide such as silicon oxycarbide.

According to some embodiments, the first to third etching stop films 21_1, 21_2 and 21_3 may include or be formed of the same material as the first to third etching stop films 311, 312 and 313 on the first interlayer insulating film 220 and/or the first to third etching stop films 211, 212 and 213 on the lower wiring 140.

The second contact trench 40*t* may penetrate the upper interlayer insulating film 22 and the etching stop film 21. The second contact trench 40*t* may include a contact lower trench 41*t* and a contact upper trench 42*t*. The contact lower trench 41*t* may penetrate at least a part of the etching stop film 21, and the contact upper trench 42*t* may penetrate the remainder of the etching stop film 21 and the upper interlayer insulating film 22. The contact lower trench 41*t* may penetrate the first etching stop film 21_1 and the second etching stop film 21_2, and the contact upper trench 42*t* may penetrate the third etching stop film 21_3 and the upper interlayer insulating film 22.

The contact spacer 43 may be disposed on the side wall of the contact lower trench 41*t*. The contact spacer 43 may extend along the side wall of the contact lower trench 41*t* to the upper surface of the lower interlayer insulating film 20.

For example, the thickness of the contact spacer 43 on the side wall of the second contact trench 40*t* may decrease in an upward direction along the third direction DR3 (e.g., away from the substrate 10). In still another example, the thickness of the contact spacer 43 on the side wall of the second contact trench 40*t* may be substantially constant.

The second contact 40 may fill the second contact trench 40*t* on the contact spacer 43.

Unlike the shown example, a spacer may also be formed between the first contact 35 and the lower interlayer insulating film 20.

FIGS. 15 to 20 are intermediate stage diagrams for explaining a method for fabricating the semiconductor device according to some embodiments. For reference, FIGS. 15 to 20 are cross-sectional views taken along A-A of FIG. 1, in which the lower wiring 140 of FIG. 1 is omitted.

Figure 15:
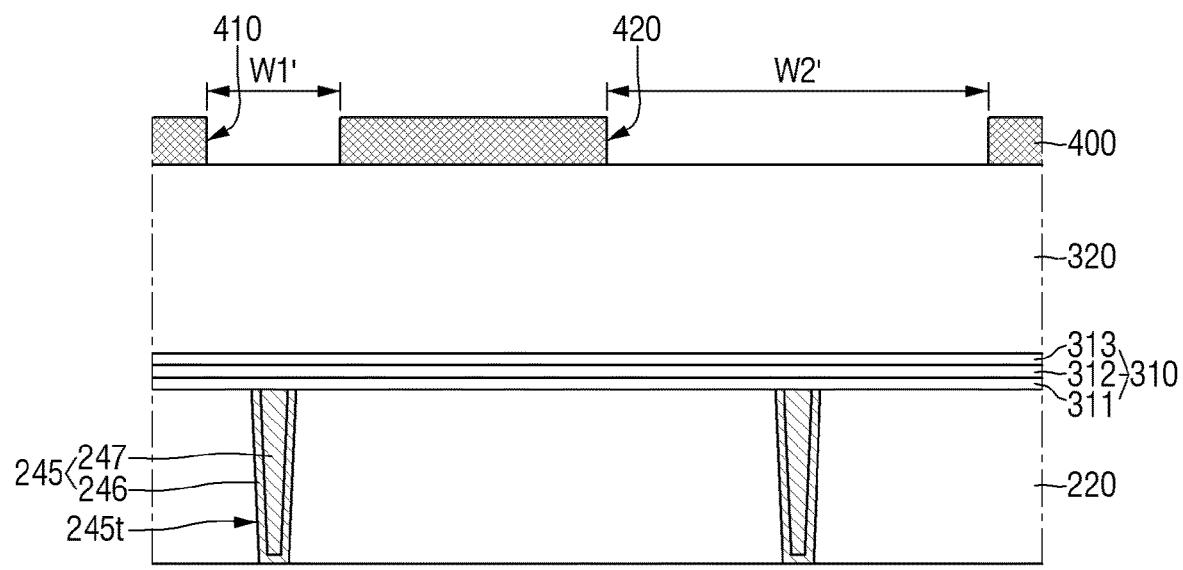
FIGS. 15 to 20 are intermediate stage diagrams for explaining a method for fabricating the semiconductor device according to some embodiments.

Referring to FIG. 15, the first interlayer insulating film 220 in which the via 245 is formed may be formed on the lower wiring 140. The etching stop film 310 in which the first etching stop film 311, the second etching stop film 312, and the third etching stop film 313 are sequentially stacked may be formed on the first interlayer insulating film 220. The second interlayer insulating film 320 may be formed on the etching stop film 310.

A mask pattern 400 may be formed on the second interlayer insulating film 320. The mask pattern 400 may include a first opening 410 and a second opening 420 that expose the upper surface of the second interlayer insulating film 320. A width W1 of the first opening 410 may be smaller than a width W2 of the second opening 420.

The mask pattern 400 may include or be formed of, for example, metals, metal nitride and metal oxide such as titanium, titanium nitride, titanium oxide, tungsten, tungsten nitride, tungsten oxide, tantalum, tantalum nitride and tantalum oxide.

Figure 16:
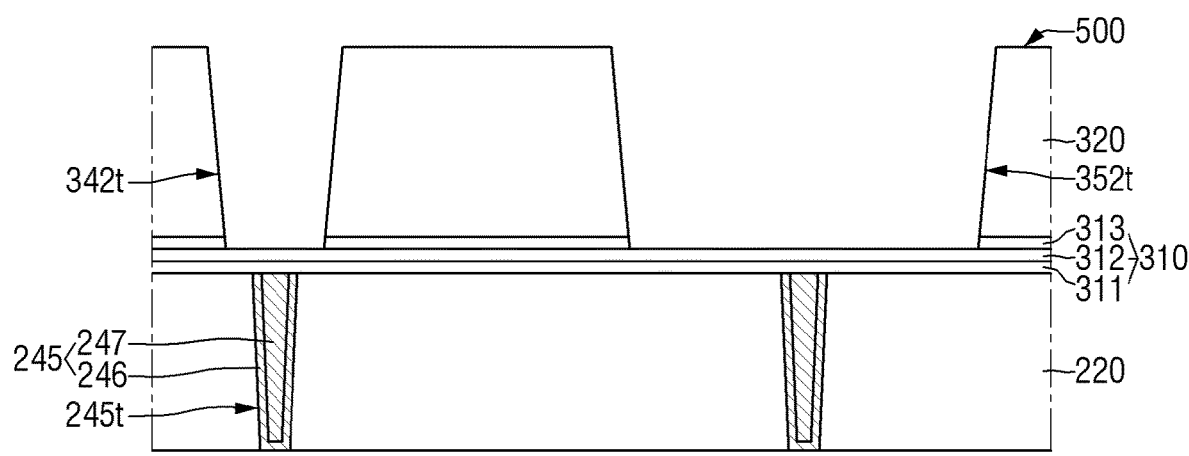

Referring to FIG. 16, an etching process is performed on the second interlayer insulating film 320, using the mask pattern 400. Accordingly, a first upper trench 342t and a second upper trench 352t having different widths from each other are formed inside the second interlayer insulating film 320. The first upper trench 342t corresponds to the first opening 410 and the second upper trench 352t corresponds to the second opening 420. The first upper trench 342t and the second upper trench 352t expose the second etching stop film 312.

In one embodiment, a slope of the side wall of the first trench 331t defined by the second interlayer insulating film 320 may differ from a slope of the side wall of the second trench 332t defined by the second interlayer insulating film 320. However, the present disclosure is not limited thereto.

The etching process may be performed, for example, by first etching the second interlayer insulating film 320 until the upper surface of the third etching stop film 313 having an etching selectivity with respect to the second interlayer insulating film 320 is exposed, and then wet-etching the exposed third etching stop film 313.

The etching by-products inside the first upper trench 342t and the second upper trench 352t may be removed by the wet-etching. At this time, the mask pattern 400 may also be removed together. The second etching stop film 312 may not be removed because it has an etching selectivity with respect to the third etching stop film 313.

For example, the aforementioned wet-etching may be performed using a solution containing hydrofluoric acid (HF).

At this time, unlike the shown example, the third etching stop film 313 exposed by the first upper trench 342t and the second upper trench 352t may be partially removed in the first direction DR1 as shown in FIG. 1. Accordingly, the side wall of the first upper trench 342t and the side wall of the second upper trench 352t inside the third etching stop film 313 may be convex toward the third etching stop film 313. The first upper trench 342t and the second upper trench 352t, which are convex toward the third etching stop film 313, may be filled by a pre spacer 330 which will be formed later.

Next, according to some embodiments, the second interlayer insulating film 320, the third etching stop film 313 and the second etching stop film 312 exposed by the first upper trench 342t, and the third etching stop film 313 and the second etching stop film 312 exposed by the second upper trench 352t may be exposed to an inhibitor plasma, thereby forming the separation layer 500. The inhibitor plasma may generate a passivated surface to suppress the formation of a pre spacer 330 that will be deposited later. For example, the separation layer 500 may be formed, by exposing the second interlayer insulating film 320, the third etching stop film 313 and the second etching stop film 312 exposed by the first upper trench 342t, and the third etching stop film 313 and the second etching stop film 312 exposed by the second upper trench 352t to the inhibitor plasma, during a first time.

According to some embodiments, because the width of the first upper trench 342t is smaller than the width of the second upper trench 352t, the bottom surface and side wall of the first upper trench 342t may be subjected to lesser plasma treatment than the bottom surface and side wall of the second upper trench 352t.

According to some embodiments, due to the shapes of the first upper trench 342t and the second upper trench 352t, the bottom surface and side walls of the first upper trench 342t, and the bottom surface and side walls of the second upper trench 352t may be subjected to lesser plasma treatment than the upper surface of the second interlayer insulating film 320.

According to some embodiments, when the width of the second upper trench 352t is large, the bottom surface of the second upper trench 352t may be subjected to plasma treatment, similar to the upper surface of the second interlayer insulating film 320.

According to some embodiments, molecular nitrogen ($N_2$) may be used as a source gas for the inhibitor plasma. As another example, the source gas of the inhibitor plasma may be selected from a group including molecular nitrogen ($N_2$), argon (Ar), helium (He), molecular hydrogen ($H_2$), ammonia ($NH_3$) or a combination thereof.

Figure 17:
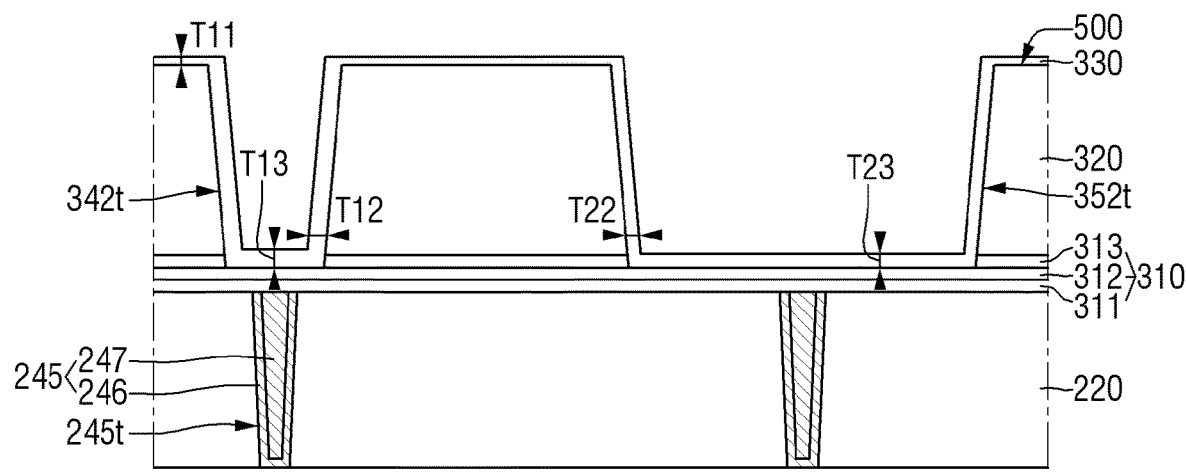

Referring to FIG. 17, an atomic layer deposition (ALD) cycle may be performed on the separation layer 500. Accordingly, the pre spacer 330 may be formed along the upper surface of the second interlayer insulating film 320, the side wall and bottom surface of the first upper trench 332t, and the side wall and bottom surface of the second upper trench 352t.

At this time, because the side wall and bottom surface of the first upper trench 342t is subjected to lesser plasma treatment than the side wall and bottom surface of the second upper trench 352t, a thickness T12 of the pre spacer 330 formed on the side wall of the first upper trench 342t may be greater than the thickness T22 of the pre spacer 330 formed on the side wall of the second upper trench 352t. A thickness T13 of the pre spacer 330 formed on the bottom surface of the first upper trench 342t may be greater than a thickness T23 of the pre spacer 330 formed on the bottom surface of the second upper trench 352t.

According to some embodiments, because the side walls and bottom surface of the first upper trench 342t and the side walls and bottom surface of the second upper trench 352t are subjected to lesser plasma treatment than the upper surface of the second interlayer insulating film 320, the thickness T12 of the pre spacer 330 on the side wall of the first upper trench 342t, the thickness T13 of the pre spacer 330 on the bottom surface of the first upper trench 342t, the thickness T22 of the pre spacer 330 on the side wall of the second upper trench 352t, and the thickness T23 of the pre spacer 330 on the bottom surface of the second upper trench 352t may be greater than the thickness T11 of the pre spacer 330 on the second interlayer insulating film 320.

According to some embodiments, when the width of the second upper trench 352t is sufficiently large, the bottom surface of the second upper trench 352t is subjected to plasma treatment similar to the upper surface of the second interlayer insulating film 320, the thickness T23 of the pre spacer 330 formed on the bottom surface of the second upper trench 352t may be substantially the same as the thickness T11 of the pre spacer 330 formed on the upper surface of the second interlayer insulating film 320.

In explaining the embodiments of the present disclosure, the formation of the separation layer 500 prior to the execution of the ALD cycle for the deposition of the pre spacer 330, for example, the execution of the inhibitor plasma treatment will be described. However, this is an example, and the disclosure is not limited thereto. For example, in some embodiments, the separation layer 500 is not formed before the first ALD cycle (or vapor deposition of the first pre spacer 330), but the separation layer 500 may be formed after at least one ALD cycle is performed.

The execution of the ALD cycle after the inhibitor plasma treatment may be performed, for example, a plurality of times. Accordingly, the separation layer 500 and the pre spacer 330 may be alternately stacked a plurality of times.

When the ALD cycle is performed a plurality of times after the inhibitor plasma treatment is performed, the times for performing each inhibitor plasma may be different or the same. Also, the concentrations of source gas used to perform each inhibitor plasma may be different from each other. Accordingly, concentrations of the inhibitor of each separation layer 500 may be different from each other. Accordingly, the thicknesses T11, T12, T13, T22 and T23 of the pre spacer 330 shown in FIG. 17 may be adjusted in various ways, depending on at least one of the number of times of execution of the inhibitor plasma, execution time, and the concentration of the source gas.

Further, although the pre spacer 330 is formed by ALD, this is an example, and the present disclosure is not limited thereto. For example, the pre spacer 330 may be formed through a SOG (Spin On Glass) process or a chemical vapor deposition (CVD) process. In exemplary embodiments, the chemical vapor deposition may include, for example, an atmospheric pressure chemical vapor deposition (AP-CVD) process, a low pressure chemical vapor deposition (LP-CVD) process, a plasma chemical vapor deposition (PE-CVD) process or a high density plasma chemical vapor deposition (HDP-CVD) process. For example, the pre spacer 330 may be formed of silicon oxide.

Figure 18:
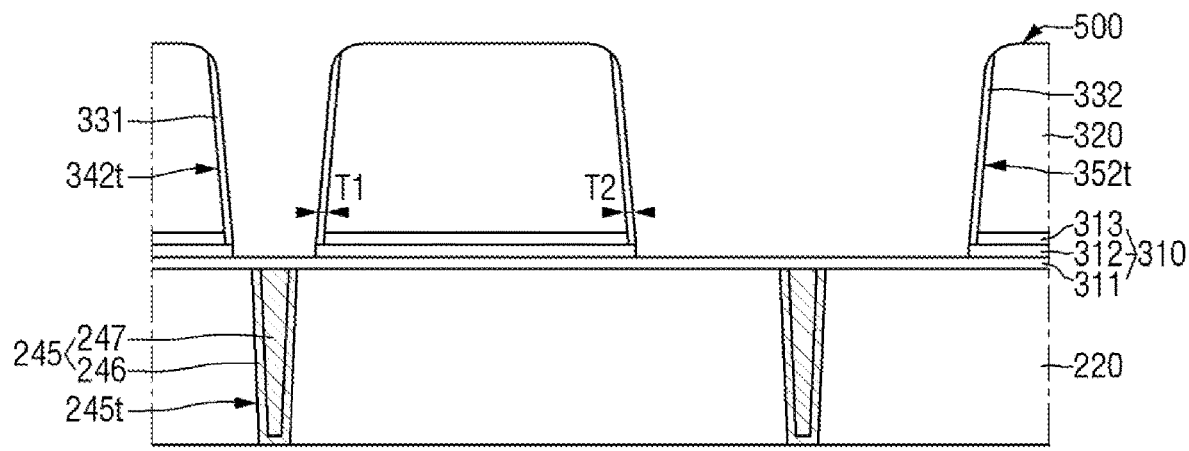

Referring to FIG. 18, by partially etching the pre spacer 330 and the second etching stop film 312, the first spacer 331 extending along the side wall of the first upper trench 342*t* and the second spacer 332 extending along the side wall of the second upper trench 352*t* may be formed. Further, the upper part of the second interlayer insulating film 320 and the upper surface of the first etching stop film 311 may be exposed.

The etching process may accompany, for example, the top corner rounding (TCR) process. Accordingly, a part of the upper part of the second interlayer insulating film 320 is etched, and the upper side wall of the second interlayer insulating film 320 may be rounded. According to some embodiments, the upper surface of the first spacer 331 and/or the second spacer 332 may also be rounded together.

Figure 19:
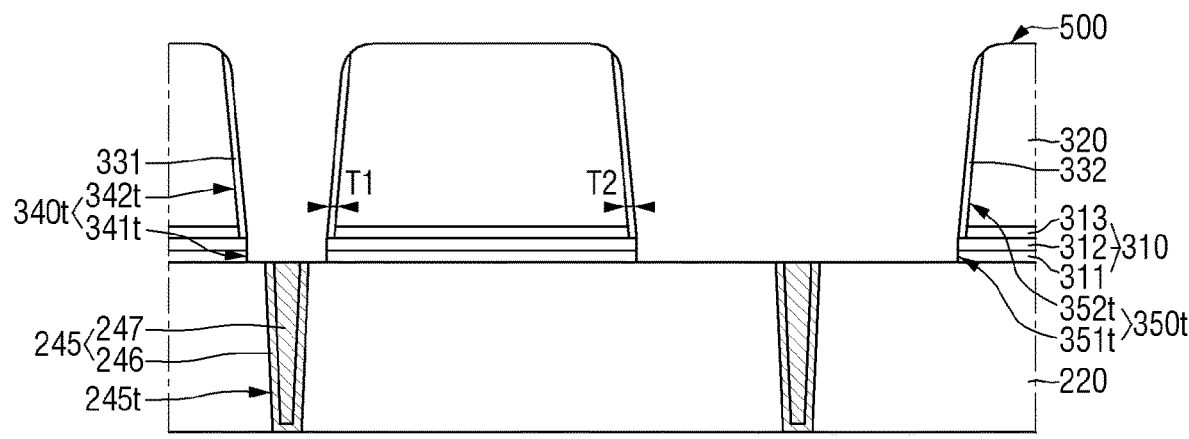

Referring to FIG. 19, a cleaning process may be performed on the exposed first etching stop film 150 to form the first lower trench 341*t* and the second lower trench 352*t*. The first lower trench 341*t* and the second lower trench 352*t* may expose the via 245 and/or the first interlayer insulating film 220.

For example, the cleaning process described above may be performed, using a solution containing hydrofluoric acid (HF).

Since the first spacer 331 and the second spacer 332 cover the third etching stop film 313, the third etching stop film 313 may not be removed in the first direction DR1 by the cleaning process. Therefore, it is possible to prevent an electrical short circuit between the first wiring 340 and the second wiring 350 due to etching of the third etching stop film 313 in the first direction DR1.

At this time and during this cleaning process, unlike the shown example, the first etching stop film 311 exposed by the first lower trench 341*t* and the second lower trench 351*t* may be partially removed in the first direction DR1 as shown in FIG. 4. Accordingly, the side wall of the first lower trench 341*t* and the side wall of the second lower trench 351*t* inside the first etching stop film 311 may be convex toward the first etching stop film 311. The first lower trench 341*t* and the second lower trench 351*t*, which are convex toward the first etching stop film 311, may be filled with a pre barrier film 341*p* to be formed later.

According to some embodiments, the thickness T1 of the first spacer 331 on the side wall of the first trench 340*t* may be substantially constant and the thickness T2 of the second spacer 332 on the side wall of the second trench 350*t* may be substantially constant, by the cleaning process.

Also, according to some embodiments, the thickness T1 of the first spacer 331 on the side wall of the first trench 340*t* may be substantially the same as the thickness T2 of the second spacer 332 on the side wall of the second trench 350*t*.

Figure 20:
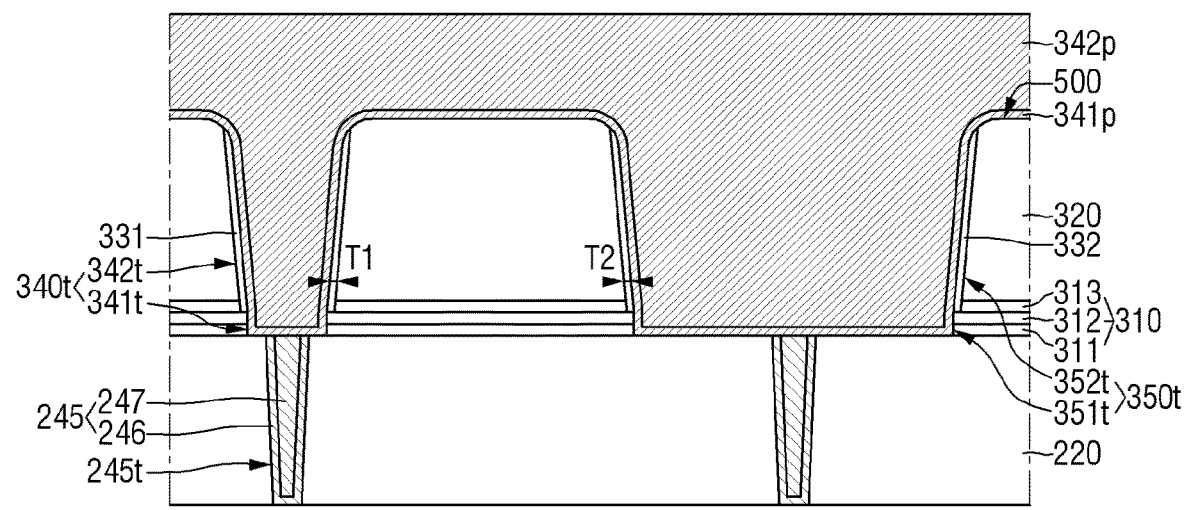

Referring to FIG. 20, a pre barrier film 341*p* and a pre filling film 342*p* may be formed. The pre barrier film 341*p* may include or be formed of the material that forms the first barrier film 341 and second barrier film 351 described previously, and the pre filling film 342*p* may include or be formed of the material that forms the first filling film 342 and second filling film 352 described previously.

The pre barrier film 341*p* may be formed along the upper surface of the second interlayer insulating film 320, the side wall of the first spacer 331, the side wall and bottom surface of the first lower trench 342*t*, the side wall of the second spacer 332, and the side wall and bottom surface of the second lower trench 352*t*. For example, the pre barrier film 341*p* may be formed conformally with a certain thickness along the upper surface of the second interlayer insulating film 320, the side wall of the first spacer 331, the side wall and bottom surface of the first lower trench 342*t*, the side wall of the second spacer 332, and the side wall and the bottom surface of the second lower trench 352*t*.

The pre filling film 342*p* may be formed on the pre barrier film 341*p*. The pre filling film 342*p* may fill the first trench 340*t* and the second trench 350*t*, and may cover the second interlayer insulating film 320.

For example, the pre filling film 342*p* may be formed by forming a seed film (not shown) on the pre barrier film 341*p* and then performing an electroplating method.

According to some embodiments, a liner (not shown) may be further formed on the pre barrier film 341*p* before forming the pre filling film 342*p*. The liner may be or may include, for example, cobalt, ruthenium and the like.

Referring to FIG. 2, by flattening the pre barrier film 341*p* and the pre filling film 342*p* until the upper surface of the second interlayer insulating film 320 is exposed, the first wiring 340 that fills the first trench 340*t*, and the second wiring 350 that fills the second trench 350*t* may be formed. According to some embodiments, the upper part of the first spacer 331 and the upper part of the second spacer 332 may be removed together with the second interlayer insulating film 320 at the time of the flattening process.

For example, the flattening process may be performed through a chemical mechanical polishing (CMP) process and/or an etch-back process.

When the top corner rounding process of the second interlayer insulating film 320 is performed without forming the pre spacer 330 on the second interlayer insulating film 320, the second interlayer insulating film 320 may be damaged. Accordingly, a parasitic capacitance between the wirings 340 and 350 may occur, and an RC delay may occur.

However, in the method for fabricating the semiconductor device according to some embodiments, the top corner rounding process of the second interlayer insulating film 320 may be performed after the pre spacer 330 is formed on the second interlayer insulating film 320. Accordingly, since damage to the second interlayer insulating film 320 may be prevented, the parasitic capacitance between the wirings 340 and 350 may be reduced, and the RC delay may be reduced.

Figure 21:
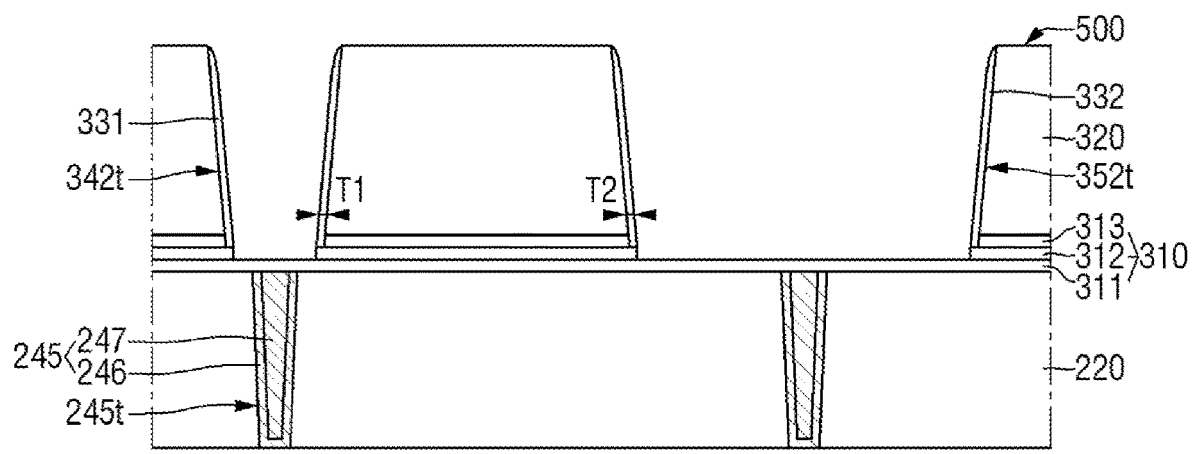
FIGS. 21 to 23 are intermediate stage diagrams for explaining the method for fabricating the semiconductor device according to some embodiments.
Figure 22:
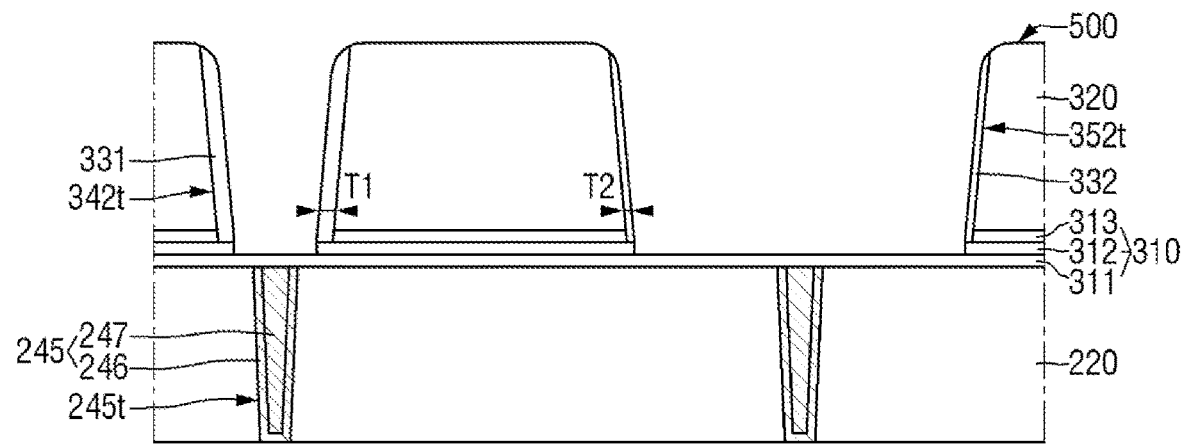
Figure 23:
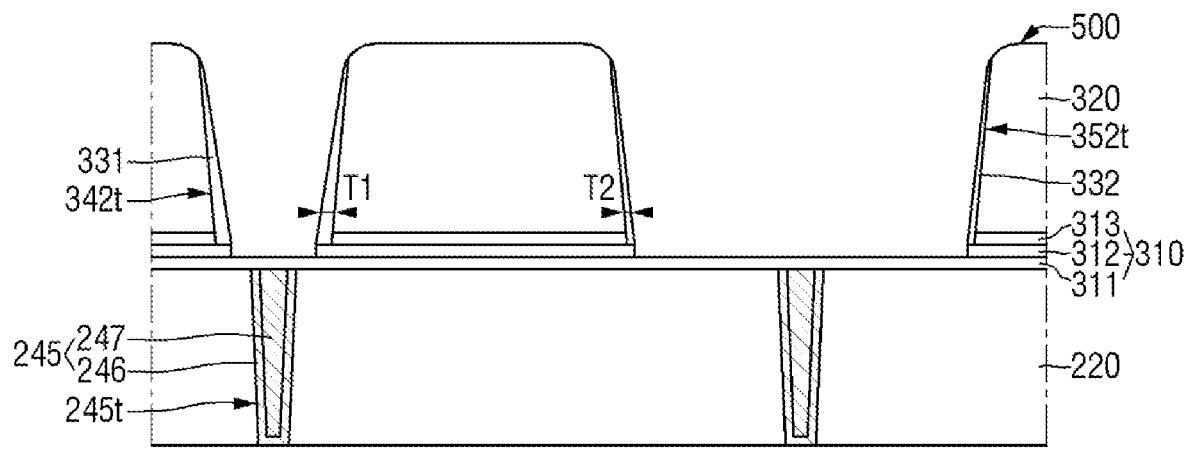

FIGS. 21 to 23 are intermediate stage diagrams for explaining the method for fabricating the semiconductor device according to some embodiments. For reference, FIGS. 21 to 23 are cross-sectional views taken along A-A of FIG. 1, in which the lower wiring 140 of FIG. 1 is omitted. FIGS. 21 to 23 are diagrams subsequent to FIG. 17, respectively.

Referring to FIG. 21, because of the first spacer 331 disposed on the side wall of the first upper trench 342t and the second spacer 332 disposed on the side wall of the second upper trench 352t, in the top corner rounding process, the upper side wall of the second interlayer insulating film 320 may not be etched. Accordingly, in the top corner rounding process, the upper surfaces of the first spacer 331 and the second spacer 332 are rounded, but the upper side wall of the second interlayer insulating film 320 may not be rounded.

Referring to FIG. 22, according to some embodiments of FIG. 17, the side walls and bottom surface of the first upper trench 342t are subjected to lesser plasma treatment than the side walls and bottom surface of the second upper trench 352t. Therefore, the thickness T12 of the pre spacer 330 formed on the side wall of the first upper trench 342t may be greater than the thickness T22 of the pre spacer 330 formed on the side wall of the second upper trench 352t. Therefore, the thickness Ti of the first spacer 331 on the side wall of the first trench 331t may be greater than the thickness T2 of the second spacer 332 on the side wall of the second trench 332t.

Referring to FIG. 23, according to some embodiments of FIG. 17, due to the shape of the first upper trench 342t and the second upper trench 352t, the side wall of the first upper trench 342t and the side wall of the second upper trench 352t may be subjected to lesser plasma treatment, as the side walls approach the first interlayer insulating film 220. The thickness T11 of the pre spacer 330 formed on the side wall of the first trench 331t and the thickness T13 of the pre spacer 330 formed on the side wall of the second trench 332t may be greater as the pre spacer 330 approaches the first interlayer insulating film 220. Therefore, the thickness Ti of the first spacer 331 on the side wall of the first trench 340t and the thickness T2 of the second spacer 332 on the side wall of the second trench 350t may decrease in a direction away from the substrate in the third direction DR3.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
an etching stop film disposed on a substrate;
an interlayer insulating film on the etching stop film;
a first trench and a second trench which are spaced apart in a first direction, and penetrate the etching stop film and the interlayer insulating film, the first trench having a side wall that exposes the interlayer insulating film, and the second trench having a side wall that exposes the interlayer insulating film;
a first spacer which covers the interlayer insulating film exposed by the side wall of the first trench and does not cover a portion of the side wall of the first trench;
a second spacer which covers the interlayer insulating film exposed by the side wall of the second trench and does not cover a portion of the side wall of the second trench;
a first barrier layer which extends along a side wall of the first spacer, the portion of the side wall of the first trench not covered by the first spacer, and a bottom surface of the first trench;
a first filling film which fills the first trench, on the first barrier layer;
a second barrier layer which extends along a side wall of the second spacer, the portion of the side wall of the second trench not covered by the second spacer, and a bottom surface of the second trench; and
a second filling film which fills the second trench, on the second barrier layer,
wherein in the first direction, a width of the first trench and a width of the second trench are different from each other, and
wherein at a first height from a bottom surface of the substrate, a thickness of the first spacer on the side wall of the first trench is different from a thickness of the second spacer on the side wall of the second trench.

2. The semiconductor device of claim 1, wherein:
the width of the first trench is smaller than the width of the second trench in the first direction, and
at the first height, the thickness of the first spacer on the side wall of the first trench is greater than the thickness of the second spacer on the side wall of the second trench.

3. The semiconductor device of claim 1, wherein the thickness of the first spacer on the side wall of the first trench and the thickness of the second spacer on the side wall of the second trench decrease, as the first spacer and the second spacer extend in a direction away from the substrate.

4. The semiconductor device of claim 1, wherein:
the etching stop film includes a first etching stop film, a second etching stop film, and a third etching stop film, which are sequentially stacked on the substrate, and
the first etching stop film includes the same material as the third etching stop film, and includes a material different from a material included in the second etching stop film.

5. The semiconductor device of claim 1, wherein the first spacer and the second spacer include silicon oxide.

6. The semiconductor device of claim 1, wherein at least one of the first spacer and the second spacer is made up of a plurality of spacer films.

7. The semiconductor device of claim 1, further comprising:
a separation layer disposed between the side wall of the first trench and the first spacer, and between the side wall of the second trench and the second spacer, and including an inhibitor.

8. The semiconductor device of claim 1, wherein an upper side wall of the first spacer and an upper side wall of the second spacer are rounded.

9. The semiconductor device of claim 1, wherein an upper side wall of the interlayer insulating film is rounded.

10. The semiconductor device of claim 1, wherein the first trench penetrates a part of the etching stop film and includes an upper trench that penetrates the interlayer insulating film and the part of the etching stop film, and a lower trench that is connected to the upper trench and penetrates the remainder of the etching stop film, wherein a width of the upper trench is greater than a width of the lower trench.

11. A semiconductor device comprising:
a via formed on a substrate;
an etching stop film disposed on the via;
an interlayer insulating film on the etching stop film;
a first trench which includes a first upper trench portion that vertically penetrates the interlayer insulating film and a part of the etching stop film, and a first lower trench portion that is connected to the first upper trench portion and vertically penetrates the remainder of the etching stop film;
a first spacer which extends along a side wall of the first upper trench portion and does not extend along a side wall of the first lower trench portion; and
a wiring which fills the first trench, on the first spacer,
wherein:
the wiring is electrically connected to the via,
the wiring extends lengthwise in a first horizontal direction,
the wiring has a first width in a second horizontal direction, which intersects the first horizontal direction,
the via has a second width in the second horizontal direction, and
the first width is greater than the second width.

12. The semiconductor device of claim 11, wherein the etching stop film includes a first etching stop film, a second etching stop film, and a third etching stop film, which are sequentially stacked on the substrate,
the first upper trench portion penetrates the third etching stop film, and
the first lower trench portion penetrates the second etching stop film and the first etching stop film.

13. The semiconductor device of claim 12, wherein a portion of the side wall of the first upper trench portion formed in the third etching stop film is convex toward the first etching stop film, and
the first spacer fills the first upper trench portion inside the third etching stop film.

14. The semiconductor device of claim 11, wherein a width of the first upper trench portion is greater than a width of the first lower trench portion.

15. The semiconductor device of claim 11, further comprising:
a second trench spaced apart from the first trench in a the first horizontal direction, and having a different width from the first trench in the first horizontal direction,
wherein:
the second trench includes a second upper trench portion that penetrates the interlayer insulating film and a part of the etching stop film, and a second lower trench portion that is connected to the second upper trench portion and penetrates the remainder of the etching stop film;
a second spacer extends along a side wall of the second upper trench portion and does not extend along a side wall of the second lower trench portion, and
a wiring fills the second trench, on the second spacer, and
wherein each of the first trench and the second trench extend lengthwise in the second horizontal direction that intersects the first horizontal direction.

16. The semiconductor device of claim 15, wherein:
a thickness of the first spacer is different from a thickness of the second spacer in the first horizontal direction.

17. The semiconductor device of claim 15, wherein:
at a first height above a bottom surface of the substrate, a thickness of the first spacer is the same as a thickness of the second spacer in the first horizontal direction.

18. The semiconductor device of claim 11, wherein the first spacer includes
a first spacer film extending along the side wall of the first trench, and
a second spacer film disposed between the first spacer film and the wiring.

19. The semiconductor device of claim 11, wherein a thickness of the first spacer on the side wall of the first upper trench portion decreases as the first spacer extends away from the substrate.

20. The semiconductor device of claim 11, wherein the first spacer is a single continuous spacer.

21. A semiconductor device comprising:
a first etching stop film, a second etching stop film, and a third etching stop film which are sequentially stacked on a substrate;
an interlayer insulating film on the third etching stop film;
a first trench and a second trench, which penetrate the interlayer insulating film and the first to third etching stop films, are spaced apart from each other in a first direction, and extend in a second direction that intersects the first direction;
a first spacer covering the interlayer insulating film and a side wall of the third etching stop film;
a second spacer covering the interlayer insulating film and a side wall of the third etching stop film;
a first barrier layer extending along a side wall of the first spacer and conformally disposed along the side walls and bottom surface of the first trench;
a first filling film which fills the first trench, on the first barrier layer;
a second barrier layer extending along a side wall of the second spacer and conformally disposed along the side walls and bottom surface of the second trench;
a second filling film which fills the second trench, on the second barrier layer; and
a separation layer disposed between the side wall of the first trench and the first spacer, and between the side wall of the second trench and the second spacer,
wherein:
in the first direction, a width of the first trench penetrating the first and second etching stop films is smaller than a width of the first trench penetrating the third etching stop film and the interlayer insulating film, and a width of the second trench penetrating the first and second etching stop films is smaller than a width of the second trench penetrating the third etching stop film and the interlayer insulating film,
in the first direction and at a first height above a bottom surface of the substrate, the width of the first trench is smaller than the width of the second trench, and
in the first direction and at the first height above the bottom surface of the substrate, a thickness of the first spacer on the side wall of the first trench is greater than a thickness of the second spacer on the side wall of the second trench.

* * * * *